US008472251B2

(12) United States Patent
Lee et al.

(10) Patent No.: US 8,472,251 B2
(45) Date of Patent: Jun. 25, 2013

(54) SINGLE-POLYCRYSTALLINE SILICON ELECTRICALLY ERASABLE AND PROGRAMMABLE NONVOLATILE MEMORY DEVICE

(75) Inventors: Peter Wung Lee, Saratoga, CA (US); Fu-Chang Hsu, San Jose, CA (US)

(73) Assignee: Aplus Flash Technology, Inc., San Jose, CA (US)

( * ) Notice: Subject to any disclaimer, the term of this patent is extended or adjusted under 35 U.S.C. 154(b) by 621 days.

(21) Appl. No.: 12/378,036

(22) Filed: Feb. 10, 2009

(65) Prior Publication Data

US 2009/0201742 A1     Aug. 13, 2009

Related U.S. Application Data

(60) Provisional application No. 61/065,418, filed on Feb. 11, 2008.

(51) Int. Cl.
| | |
|---|---|
| *G11C 16/04* | (2006.01) |
| *G11C 11/34* | (2006.01) |
| *H01L 29/788* | (2006.01) |
| *H01L 29/66* | (2006.01) |

(52) U.S. Cl.
USPC .............. 365/185.1; 365/185.08; 257/316; 257/319; 257/320; 257/E29.3; 257/E29.345

(58) Field of Classification Search
USPC .................................................. 365/185.1
See application file for complete search history.

(56) References Cited

U.S. PATENT DOCUMENTS

| | | | | |
|---|---|---|---|---|
| 5,465,231 | A | * | 11/1995 | Ohsaki ................. 365/185.33 |
| 5,898,616 | A | * | 4/1999 | Ono ...................... 365/185.17 |
| 5,929,478 | A | | 7/1999 | Parris et al. |
| 6,307,233 | B1 | * | 10/2001 | Awaka et al. ............... 257/368 |
| 6,512,700 | B1 | * | 1/2003 | McPartland et al. ...... 365/185.28 |
| 6,992,927 | B1 | | 1/2006 | Poplevine et al. |
| 7,164,606 | B1 | | 1/2007 | Poplevine et al. |
| 7,263,001 | B2 | | 8/2007 | Wang et al. |
| 7,447,064 | B1 | * | 11/2008 | Bu et al. ................. 365/185.01 |
| 7,542,342 | B2 | * | 6/2009 | Kalnitsky et al. ........ 365/185.1 |
| 7,593,261 | B2 | * | 9/2009 | Park et al. .............. 365/185.05 |
| 7,623,380 | B2 | * | 11/2009 | Yamamoto et al. ...... 365/185.1 |

(Continued)

OTHER PUBLICATIONS

PCT Search Report—PCT/US 09/00846 Mail date—Mar. 20, 2012, Aplus Flash Technology, Inc.

(Continued)

*Primary Examiner* — Son Mai
(74) *Attorney, Agent, or Firm* — Saile Ackerman LLC; Stephen B. Ackerman; Billy Knowles

(57) ABSTRACT

A single polycrystalline silicon floating gate nonvolatile memory cell has a MOS capacitor and a storage MOS transistor fabricated with dimensions that allow fabrication using current low voltage logic integrated circuit process. The MOS capacitor has a first plate connected to a gate of the storage MOS transistor to form a floating gate node. The physical size of the MOS capacitor is relatively large (approximately 10 time greater) when compared to a physical size of the storage MOS transistor to establish a large coupling ratio (greater than 80%) between the second plate of the MOS capacitor and the floating gate node. When a voltage is applied to the second plate of the MOS capacitor and a voltage applied to the source region or drain region of the MOS transistor establishes a voltage field within the gate oxide of the MOS transistor such that Fowler-Nordheim edge tunnel is initiated.

65 Claims, 13 Drawing Sheets

U.S. PATENT DOCUMENTS

| | | | |
|---|---|---|---|
| 7,646,638 B1 * | 1/2010 | Bu | 365/185.05 |
| 7,688,627 B2 * | 3/2010 | Haggag et al. | 365/185.08 |
| 7,755,135 B2 * | 7/2010 | Yoo et al. | 257/321 |
| 8,000,137 B2 * | 8/2011 | Ogura et al. | 365/185.05 |
| 2004/0063291 A1 | 4/2004 | Williams et al. | |
| 2005/0110073 A1 | 5/2005 | Spadea | |
| 2005/0184326 A1 | 8/2005 | Cheng | |
| 2007/0120176 A1 * | 5/2007 | Tanaka | 257/316 |
| 2011/0305084 A1 * | 12/2011 | Park | 365/185.08 |

OTHER PUBLICATIONS

"A New Single-poly Flash Memory Cell with Low-voltage and Low-power Operations for Embedded Applications," by Min-Hwa Chi et al., published in Deviced Research Conference Digest, 1997, 5th, Issue Date: Jun. 23-25, 1997, pp. 126-127.

* cited by examiner

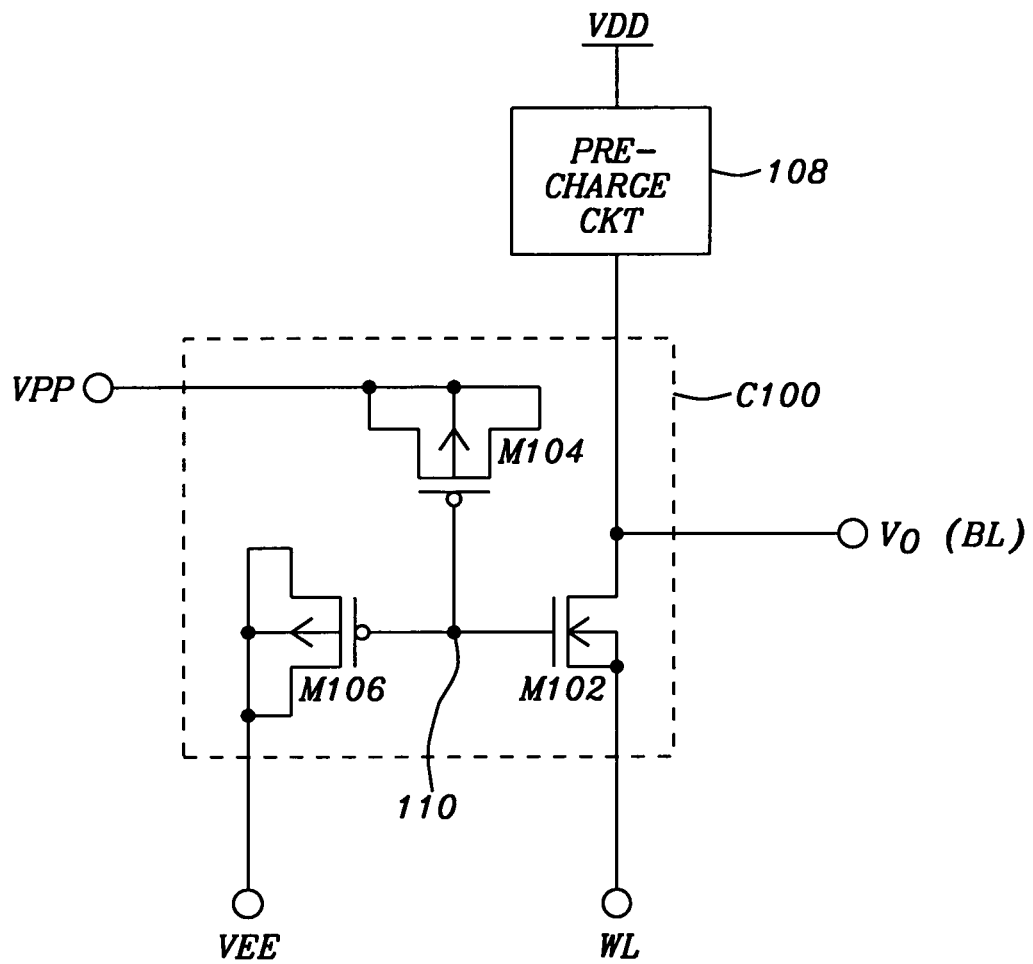
FIG. 1 – Prior Art

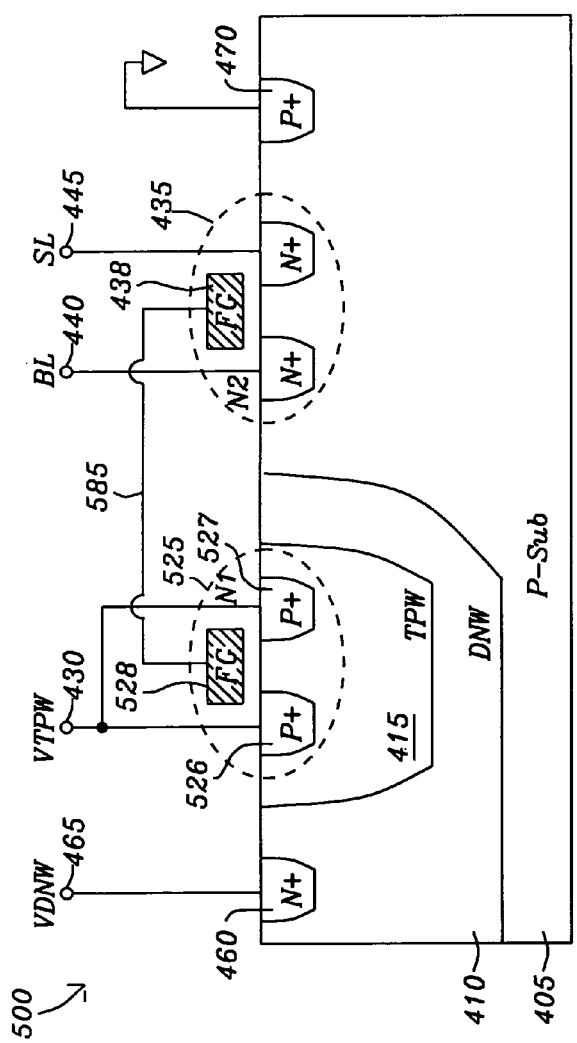
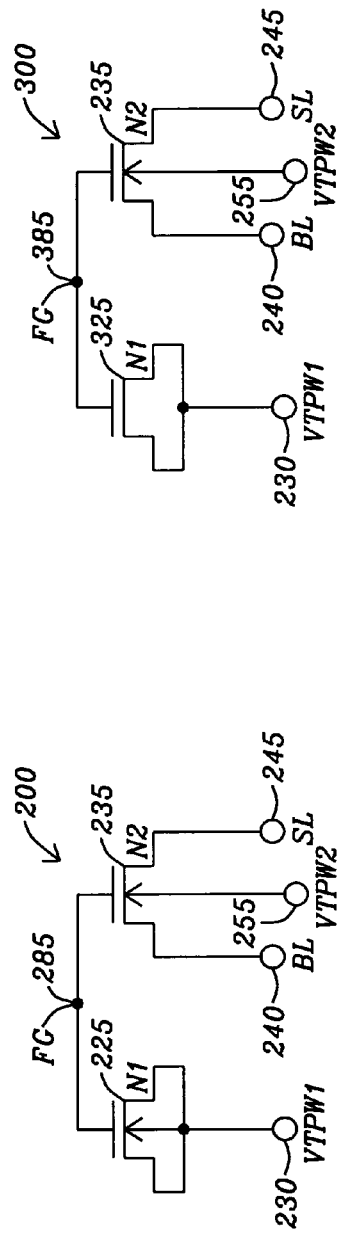

SINGLE-POLYCRYSTALLINE SILICON ELECTRICALLY ERASABLE AND PROGRAMMABLE NONVOLATILE MEMORY DEVICE

This application claims priority under 35 U.S.C. §119 to U.S. Provisional Patent Application Ser. No. 61/065,418, filed on Feb. 11, 2008, which is herein incorporated by reference in its entirety.

BACKGROUND OF THE INVENTION

1. Field of the Invention

This invention relates generally to a non-volatile integrated circuit memory. More particularly this invention relates to single polycrystalline silicon floating gate electrically erasable programmable read only memory (EEPROM) and flash electrically erasable programmable read only memory (flash memory).

2. Description of Related Art

In the semiconductor industry, generally, there are two important kinds of CMOS memories—"volatile" and "nonvolatile". The "volatile" memory, in which the stored data is not retained when its low-voltage VDD power supply is removed or shut down. The volatile memories include Static Random Access Memory (SRAM) and Dynamic Random Access Memory (DRAM).

The "non-volatile" memory (NVM), in which the stored data would not be corrupted and normally is retained for more than 20 years even after the power supply voltage source (VDD) is completely disconnected. Today, there are many different kinds of NVM memories aimed for different applications. For example, the most popular NVM today is NAND flash with a very small cell size of about 0.5 T cell size of $4\lambda^2$ ($\lambda^2$ being the smallest area capable for a given semiconductor process) and is generally used to store huge blocks of data necessary for audio and video serial applications. The highest available memory density is up to 16 Gb and is currently made of 45 nm in 2008. The second largest revenue of NVM is NOR flash with one-transistor cell of about $10\lambda^2$ and is used to store the program code. Today, the highest available NOR memory density is about 2 Gb in the market place and is made of 70 nm in 2007. The third type of NVM is 2-transistor floating gate tunnel oxide (FLOTOX) EEPROM with cell size of about $80\lambda^2$. Currently, the density of EEPROM is around 1 Mb only and is used in byte-alterable application. Unlike NAND and NOR Flash Ram that only allows big-block data alterability, EEPROM can achieve the largest number of program/erase (P/E) cycles. In the current design, the EEPROM is capable of 1M P/E cycles when accomplished in units of bytes for small data change applications.

There are several disadvantages for NVM. The on-chip, high-voltage devices, charge-pump circuits, and the complicated double-polycrystalline silicon cell structure are required for the basic erase and program operations. Currently the above NVM cell devices are made of a complicated, double-polycrystalline silicon, high-voltage process.

There are several disadvantages for the double-polycrystalline NVM cells, described above. The required voltages for performing a program and erase operation are too high for devices that are fabricated using standard CMOS logic process. For example, the current 0.5 transistor per NAND cell structure requires +20V for Fowler-Nordheim tunneling program or erase operations. For a single transistor NOR flash cell, the channel-hot-electron program operation needs about +10V. However, the Fowler-Nordheim tunneling erase operation, requires both +10V and −10V. A current two-transistor EEPROM memory cell structure requires +15V for both Fowler-Nordheim tunneling program erase. As a consequence, the program and erase operations for the above described three NVM cells require an on-chip charge-pump circuit that provides the high-voltage levels that range from approximately 10V to approximately 20V. The peripheral devices of the NVM array thus require a high voltage breakdown for the operation. The high-voltage breakdown voltages are not compatible with the current process technology for the peripheral single-poly low-voltage logic devices. Having to implement the necessary process modifications to accomplish this high-voltage breakdown device requires that the manufacturing cost be increased.

"A New Single-Poly Flash Memory Cell with Low-Voltage and Low-Power Operations for Embedded Applications", Chi, et al., The 5th Annual IEEE Device Research Conference Digest, June 1997, pp: 126-127, Posted ieeexlore.ieee.org: 2002-08-06 21:21:45.0, discusses a single-poly flash memory cell structure on triple-well CMOS technology and new program/erase schemes with operating voltage not exceeding ±Vcc. Conventional single-poly EPROM, although fully compatible with standard CMOS fabrication, suffers from high-voltage operation, slow programming, and incapability of electrical erase. The flash cell with the program/erase schemes permits low-voltage and low-power nonvolatile memory applications in CMOS mixed-signal circuits of system-on-a-chip.

U.S. Pat. No. 5,929,478 (Parris, et al.) describes a single level gate nonvolatile memory device that includes a floating gate FET and a capacitor fabricated in two P-wells formed in an N-epitaxial layer on a P-substrate. P+ sinkers and N-type buried layers provide isolation between the two P-wells. The NVM device is programmed or erased by biasing the FET and the capacitor to move charge carriers onto or away from a conductive layer which serves as a floating gate of the FET. Data is read from the NVM device by sensing a current flowing in the FET while applying a reading voltage to the capacitor.

U.S. Pat. Nos. 6,992,927 and 7,164,606 (Poplevine, et al.) provides a NVM array that includes four-transistor PMOS non-volatile memory (NVM) cells having commonly connected floating gates. Each of the four transistors execute distinct control, erase, write and read operations, thereby allowing each device to be individually selected and optimized for performing its respective operation.

U.S. Pat. No. 7,263,001 (Wang, et al.) teaches a non-volatile memory cell and array system. The array system includes rows and columns of NVM cells. Each of the NVM cells includes a floating gate, a programming element, and a logic storage element. During a programming or erase mode, the floating gate of each cell is charged to a predetermined level. At the beginning of a read mode, all storage elements are pre-charged to a high supply voltage level. Following the pre-charge, selected cells are read to determine stored bit values. A charge status of the floating gate of each cell determines whether the storage element is turned on and the precharge voltage is pulled down corresponding to a bit value.

SUMMARY OF THE INVENTION

An object of this invention is to provide a single-polycrystalline floating gate NVM memory cell that is very compatible with the existing single polycrystalline silicon logic device process with minor change by adding one or two process layers and a low operating voltage level of a power supply voltage source.

Another object of this invention is to provide a single-polycrystalline floating gate NVM memory cell that has program and erase voltages less than 6.0V.

Further, another object of this invention is to provide a single-polycrystalline floating gate NVM memory cell that is programmed and erased with very low-current, Fowler Nordheim edge tunneling for programming and erasing.

Still another object of this invention is to provide a single-polycrystalline floating gate NVM memory cell that is smaller than the NVM memory cells of the prior art.

Still further another object of this invention is to provide a single-polycrystalline floating gate NVM memory cell that has the multiple program and erase capability (P/E endurance cycles).

To accomplish at least one of these objects, a single polycrystalline silicon floating gate nonvolatile memory cell has a MOS capacitor and a MOS transistor fabricated with dimensions that allow fabrication using current low voltage logic integrated circuit process. The MOS capacitor has first plate connected to a gate of the MOS transistor such that the gate of the MOS transistor is floating and forms a floating gate node of the floating gate nonvolatile memory cell. The second plate of the MOS capacitor is normally a drain diffusion, source diffusion, and bulk of a MOS transistor. The drain of the MOS transistor is connected to a bit line voltage source and the source of the MOS transistor is connected to a source line. The physical size of the MOS capacitor is relatively large when compared to the physical size of the MOS transistor. The ratio of the physical size of the MOS capacitor to that of the MOS transistor is 10 times or greater for the embodiments of this invention.

The large ratio of physical size between the MOS capacitor and the MOS transistor provides a large coupling ratio of greater than 80%. When a voltage is applied to the second plate of the MOS capacitor, the large coupling ratio enables the coupling of a large fraction of the voltage applied to the second plate of the MOS capacitor to be coupled to the floating gate node. A voltage is applied to the source region or drain region of the MOS transistor establishes a voltage field within the gate oxide of the MOS transistor such that Fowler-Nordheim edge tunnel is initiated. When the voltage at the second plate is negative and the voltage applied to the drain (or source) of the MOS transistor is positive, charges present on the floating gate are extracted to program the floating gate nonvolatile memory cell. Alternately, the voltage at the second plate is positive and the voltage applied to the drain (or source or bulk) of the MOS transistor is negative. Charges present on the floating gate are injected to erase the floating gate nonvolatile memory cell. The above described embodiments provide variations and details of this structure and voltage levels required for establishing the Fowler-Nordheim tunneling.

One embodiment of a nonvolatile memory cell that is formed on a substrate has first deep diffusion well of an impurity of a first conductivity type (N-type impurity) is formed in the surface of the substrate. The first deep diffusion well is connected to a first deep well biasing voltage source. A first shallow diffusion well and a second shallow diffusion well of an impurity of a second conductivity type (P-type impurity) is formed within the first deep diffusion well. The first shallow diffusion well is connected to a first well biasing voltage source. The second shallow diffusion well is connected to a second well biasing voltage source.

The nonvolatile memory cell has a programming charge coupling metal oxide semiconductor (MOS) transistor connected as a capacitor. The programming charge coupling MOS transistor has a program coupling floating gate formed of a single polycrystalline silicon layer. The program coupling floating gate has a size that provides a large coupling ratio from the floating gate to the first shallow diffusion well. The programming charge coupling MOS transistor has a source region and a drain region of the impurity of the first conductivity type diffused into the first shallow diffusion well.

The nonvolatile memory cell has a storage MOS transistor. The storage MOS transistor has a charge storage floating gate formed of the single polycrystalline silicon layer. The charge storage floating gate is connected to the program coupling floating gate such that charge coupled to the coupling floating gate is collected on the charge storage floating gate. The storage MOS transistor has a source region and a drain region of the impurity of the first conductivity type diffused into the second shallow diffusion well. The source region is connected to a source line biasing voltage source and the drain is connected to a bit line biasing voltage source. The threshold voltage of the storage MOS transistor is set to an erased threshold voltage level to erase the nonvolatile memory cell and to a programmed threshold voltage level to program the nonvolatile memory cell.

The nonvolatile memory cell is programmed by Fowler-Nordheim charge tunneling through a gate oxide between the charge storage floating gate and the drain region of the storage MOS transistor. The nonvolatile memory cell is programmed by setting the first well biasing voltage source to a voltage level of from approximately −7.0V to approximately −5.0V and the bit line biasing voltage source to a voltage level of from approximately +5.0V to approximately +7.0V to set the threshold voltage of the storage MOS transistor to the programmed threshold voltage level. The programmed threshold voltage level is from approximately 0.0V to approximately 1.0V.

The nonvolatile memory cell is erased by setting the threshold voltage of the storage MOS transistor to the erased threshold voltage level. The erased threshold voltage level is from approximately +3.0V to approximately +4.0V.

Reading the nonvolatile memory cell detects whether the threshold voltage of the storage MOS transistor is the programmed threshold voltage level or the erased threshold voltage level. In reading the nonvolatile memory cell, the second shallow diffusion well is set to a voltage level that is greater than the programmed threshold voltage level and less than the erased threshold voltage level and the bit line biasing voltage source biasing voltage level is set to approximately +1.0V.

In another embodiment, the nonvolatile memory cell additionally includes a select gating transistor. The select gating transistor includes a select gate connected to a select gate control terminal. A source region of the impurity of the first conductivity type diffused into the second shallow diffusion well and connected to the source line biasing voltage source. A drain region of the impurity of the first conductivity type is the source region of the storage MOS transistor.

The nonvolatile memory cell is programmed by setting the first well biasing voltage source to a voltage level of from approximately −7.0V to approximately −5.0V, and the bit line biasing voltage source to a voltage level of from approximately +5.0V to approximately +7.0V, and the select gate control terminal is set to a deactivation voltage level to turn off the select gate MOS transistor to set the threshold voltage of the storage MOS transistor to the programmed threshold voltage level.

The reading the nonvolatile memory cell detects whether the threshold voltage of the storage MOS transistor is the programmed threshold voltage level or the erased threshold voltage level. In reading the nonvolatile memory cell, the second shallow diffusion well is set to a voltage level that is greater than the programmed threshold voltage level and less than the erased threshold voltage level. The bit line biasing voltage source biasing voltage level is set to approximately +1.0V, the source line biasing voltage source is set to the ground reference voltage level, and the select gate control terminal is set to an activation voltage level to turn on the select gate MOS transistor to read a program state of the nonvolatile memory cell.

In still another embodiment, the nonvolatile memory cell further includes a second deep diffusion well of the impurity of the first conductivity type formed in the surface of the substrate that is connected to a second deep well biasing voltage source. A third shallow diffusion well of the impurity of the second conductivity type is then formed within the second deep diffusion well and is connected to a third well biasing voltage source. An erasing charge coupling MOS transistor is then formed in the third shallow diffusion well. The erasing charge coupling MOS transistor has an erase coupling floating gate that is formed of the single polycrystalline silicon layer. The coupling floating gate is connected to the program coupling floating gate and the charge storage floating gate and has a small size relative to the program coupling floating gate. The erasing charge coupling MOS transistor has a source region and a drain region of the impurity of the first conductivity type diffused into the third shallow diffusion well.

The drain of the erasing charge coupling MOS transistor is connected to an erase line biasing voltage source. The nonvolatile memory cell is programmed by Fowler-Nordheim charge tunneling through a gate oxide between the charge storage floating gate and the drain region of the storage MOS transistor. The programming of the nonvolatile memory cell is accomplished by setting the first well biasing voltage source to a voltage level of from approximately −7.0V to approximately −5.0V and the bit line biasing voltage source to a voltage level of from approximately +5.0V to approximately +7.0V to set the threshold voltage of the storage MOS transistor to the programmed threshold voltage level. The programmed threshold voltage level is from approximately 0.0V to approximately 1.0V.

The nonvolatile memory cell is erased by Fowler-Nordheim charge tunneling through a gate oxide between the erase coupling floating gate and a channel region of the erasing charge coupling MOS transistor set the threshold voltage of the storage MOS transistor to the erased threshold voltage level. The erased threshold voltage level is from approximately +3.0V to approximately +4.0V. The erasing of the nonvolatile memory cell is accomplished by setting the erase line biasing voltage source to a voltage level of from approximately −7.0V to approximately −5.0V the first well biasing voltage source to a voltage level of from approximately +5.0V to approximately +7.0V, the third well biasing voltage source to a voltage level of from approximately −7.0V to approximately −5.0V, and the first deep well biasing voltage source to a voltage level of from approximately +5.0V to approximately +7.0V set the threshold voltage of the storage MOS transistor to the erased threshold voltage level.

In reading the nonvolatile memory cell, the threshold voltage of the storage MOS transistor is detected to determine if the nonvolatile memory cell has the programmed threshold voltage level or the erased threshold voltage level. In reading the nonvolatile memory cell, the second shallow diffusion well is set to a voltage level that is greater than the programmed threshold voltage level and less than the erased threshold voltage level and the bit line biasing voltage source biasing voltage level is set to approximately +1.0V.

In even another embodiment, the nonvolatile memory cell further includes a second deep diffusion well of an impurity of the first conductivity (N-type impurity) type formed in the surface of the substrate and connected to a second deep diffusion well is connected to a second deep well biasing voltage source. An erasing charge coupling MOS transistor is formed in the surface of the second deep diffusion well and has a erase coupling floating gate formed the single polycrystalline silicon layer connected to the program coupling floating gate and the charge storage floating gate. The erasing charge coupling floating gate has a small size relative to the program coupling floating gate. In this embodiment of the nonvolatile memory cell, the source region and drain region of the erasing charge coupling MOS transistor is formed of the impurity of the first conductivity type diffused into the second deep diffusion well. The source region and drain region of the erasing charge coupling MOS transistor is connected to an erase line biasing voltage source.

The nonvolatile memory cell is erased by Fowler-Nordheim charge tunneling through a gate oxide between the erase coupling floating gate and a channel region of the erasing charge coupling MOS transistor set the threshold voltage of the storage MOS transistor to the erased threshold voltage level. The erased threshold voltage level is from approximately +3.0V to approximately +4.0V. To erase the nonvolatile memory cell the erase line biasing voltage source is set to a voltage level of from approximately −7.0V to approximately −5.0V the first well biasing voltage source is set to a voltage level of from approximately +5.0V to approximately +7.0V, the third well biasing voltage source is set to a voltage level of from approximately −7.0V to approximately −5.0V, and the first deep well biasing voltage source is set to a voltage level of from approximately +5.0V to approximately +7.0V to set the threshold voltage of the storage MOS transistor to the erased threshold voltage level.

A further embodiment of a nonvolatile memory cell formed on a substrate includes a common deep diffusion well of an impurity of a first conductivity type (N-type impurity) formed in a surface of the substrate and is connected to a deep well biasing voltage source. A first shallow diffusion well and a second shallow diffusion well of an impurity of a second conductivity type (P-type impurity) is formed within the common deep diffusion well. A charge coupling MOS capacitor is formed within the first shallow diffusion well and includes a coupling floating gate formed of a single polycrystalline silicon layer having a size such that a coupling ratio is very large. A source region and a drain region of an impurity of the second conductivity type diffused into the first shallow diffusion well. The source region and the drain region are commonly connected to a first well biasing voltage source. The second shallow diffusion well is connected to a second well biasing voltage source The nonvolatile memory cell has a storage MOS transistor with a charge storage floating gate formed of the single polycrystalline silicon layer connected to the coupling floating gate such that charge coupled to the coupling floating gate is collected on the charge storage floating gate. A source region and a drain region of the impurity of the first conductivity type diffused into the second shallow diffusion well. The source region is connected to a source line biasing voltage source and a drain region is connected to a bit line biasing voltage source. The threshold voltage of the storage MOS transistor is set to an erased threshold voltage level to erase the nonvolatile memory cell and to a programmed threshold voltage level to program the nonvolatile memory cell.

The nonvolatile memory cell is programmed by Fowler-Nordheim charge tunneling through a gate oxide between the charge storage floating gate and the drain region of the storage MOS transistor. The programming of the nonvolatile memory cell is accomplished by setting the first well biasing voltage source to a voltage level of from approximately −7.0V to approximately −5.0V and the bit line biasing voltage source to a voltage level of from approximately +5.0V to approximately +7.0V to set the threshold voltage of the storage MOS transistor to the programmed threshold voltage level. The programmed threshold voltage level is from approximately 0.0V to approximately 1.0V.

The nonvolatile memory cell is erased by setting the threshold voltage of the storage MOS transistor to the erased threshold voltage level. The erased threshold voltage level is from approximately +3.0V to approximately +4.0V.

The nonvolatile memory cell is read by detecting whether the threshold voltage of the storage MOS transistor is the programmed threshold voltage level or the erased threshold voltage level. In the reading the nonvolatile memory cell, the second shallow diffusion well is set to a voltage level that is greater than the programmed threshold voltage level and less than the erased threshold voltage level and the bit line biasing voltage source biasing voltage level is set to approximately +1.0V.

In another embodiment, a nonvolatile memory cell that is formed on a substrate includes a deep diffusion well of an impurity of a first conductivity type (N-type impurity) formed in a surface of the substrate and is connected to a deep well biasing voltage source. A shallow diffusion well of an impurity of a second conductivity type (P-type impurity) is formed within the common deep diffusion well. The nonvolatile memory cell has a charge coupling metal oxide semiconductor (MOS) transistor that is connected as a capacitor. The charge coupling MOS transistor includes a coupling floating gate formed a single polycrystalline silicon layer having a size that a coupling ratio from the floating gate to the shallow diffusion well is very large. A source region and a drain region of the impurity of the first conductivity type are diffused into the shallow diffusion well. The source region and the drain region are commonly connected to the shallow diffusion well and a first well biasing voltage source.

The nonvolatile memory cell has a storage MOS transistor that has a charge storage floating gate formed of a single polycrystalline silicon layer connected to the coupling floating gate such that charge coupled to the coupling floating gate is collected on the charge storage floating gate. A source region and a drain region of the impurity of the first conductivity type are diffused into the substrate. The source region is connected to a source line biasing voltage source and the drain region is connected to a bit line biasing voltage source. The threshold voltage of the storage MOS transistor is set to an erased threshold voltage level to erase the nonvolatile memory cell and to a programmed threshold voltage level to program the nonvolatile memory cell.

The nonvolatile memory cell is programmed by Fowler-Nordheim charge tunneling through a gate oxide between the charge storage floating gate and the drain region of the storage MOS transistor. The nonvolatile memory cell is programmed by setting the first well biasing voltage source to a voltage level of from approximately −7.0V to approximately −5.0V and the bit line biasing voltage source to a voltage level of from approximately +5.0V to approximately +7.0V to set the threshold voltage of the storage MOS transistor to the programmed threshold voltage level. The programmed threshold voltage level is from approximately 0.0V to approximately 1.0V.

The nonvolatile memory cell is erased by setting the threshold voltage of the storage MOS transistor to the erased threshold voltage level that is from approximately +3.0V to approximately +4.0V. The reading the nonvolatile memory cell detects whether the threshold voltage of the storage MOS transistor is the programmed threshold voltage level or the erased threshold voltage level. In reading the nonvolatile memory cell, the second shallow diffusion well is set to a voltage level that is greater than the programmed threshold voltage level and less than the erased threshold voltage level and the bit line biasing voltage source biasing voltage level is set to approximately +1.0V.

In again another embodiment, a nonvolatile memory cell, as formed on a substrate, includes a deep diffusion well of an impurity of a first conductivity type (N-type impurity) formed in a surface of the substrate and connected to a deep well biasing voltage source. A shallow diffusion well of an impurity of a second conductivity type (P-type impurity) formed within the common deep diffusion well. A charge coupling metal oxide semiconductor (MOS) transistor is connected as a capacitor. The charge coupling MOS transistor has a coupling floating gate formed of a single polycrystalline silicon layer having a size such that a coupling ratio from the floating gate to the shallow diffusion well is very large. A source region and a drain region of the impurity of the first conductivity type is diffused into the shallow diffusion well. The source region, the drain region, and the source region are commonly connected to a first well biasing voltage source.

The nonvolatile memory cell additionally includes a charge coupling MOS capacitor. The charge coupling MOS capacitor has a coupling floating gate that formed of the single polycrystalline silicon layer and has a size such that a coupling ratio from the floating gate to the shallow diffusion well is very large. A source region and a drain region of an impurity of the second conductivity type is diffused into the shallow diffusion well. The drain region, the source region, and the shallow diffusion well are commonly connected to a first well biasing voltage source. The threshold voltage of the storage MOS transistor is set to an erased threshold voltage level to erase the nonvolatile memory cell and to a programmed threshold voltage level to program the nonvolatile memory cell.

The nonvolatile memory cell is programmed by Fowler-Nordheim charge tunneling through a gate oxide between the charge storage floating gate and the drain region of the storage MOS transistor. The Fowler-Nordheim charge tunneling is activated to program the nonvolatile memory cell by setting the first well biasing voltage source to a voltage level of from approximately −7.0V to approximately −5.0V and the bit line biasing voltage source to a voltage level of from approximately +5.0V to approximately +7.0V to set the threshold voltage of the storage MOS transistor to the programmed threshold voltage level. The programmed threshold voltage level is from approximately 0.0V to approximately 1.0V.

The nonvolatile memory cell is erased by setting the threshold voltage of the storage MOS transistor to the erased threshold voltage level. The erased threshold voltage level is from approximately +3.0V to approximately +4.0V.

Reading the nonvolatile memory cell detects whether the threshold voltage of the storage MOS transistor is the programmed threshold voltage level or the erased threshold voltage level. In reading the nonvolatile memory cell, the second shallow diffusion well is set to a voltage level that is greater than the programmed threshold voltage level and less than the erased threshold voltage level. The bit line biasing voltage source biasing voltage level is set to approximately +1.0V and the source line biasing voltage source is set to the ground reference voltage level.

In a further embodiment, a nonvolatile memory cell, as formed on a substrate, includes a first deep diffusion well and a second deep diffusion well of an impurity of a first conductivity type (N-type impurity) formed in a surface of the substrate. A first shallow diffusion and second shallow diffusion well of an impurity of a second conductivity type (P-type impurity) is formed respectively within the first deep diffusion well and the second deep diffusion wells. The nonvolatile memory cell includes a charge coupling metal oxide semiconductor (MOS) transistor that is connected as a capacitor has a coupling floating gate that formed of a single polycrystalline silicon layer having a size such that a coupling ratio is very large. A source region and a drain region of the impurity of the first conductivity type is diffused into the first shallow diffusion well. The drain region, the source region, and the first shallow diffusion well are commonly connected to a first well biasing voltage source. The second shallow diffusion well is connected to a second well biasing voltage source. The first deep diffusion well is connected to a first deep well biasing voltage source. The second deep diffusion well is connected to a second deep well biasing voltage source.

The nonvolatile memory cell has a storage MOS transistor that has a charge storage floating gate that is formed of the single polycrystalline silicon layer and is connected to the program coupling floating gate such that charge coupled to the coupling floating gate is collected on the charge storage floating gate. A source region of the impurity of the first conductivity type is diffused into the second shallow diffusion well and is connected to a source line biasing voltage source. A drain region of the impurity of the first conductivity type is diffused into the second shallow diffusion well and is connected to a bit line biasing voltage source. The nonvolatile memory cell further includes a select gate MOS transistor that has a select gate connected to a select gate control terminal. A source region of the impurity of the first conductivity type is diffused into the second shallow diffusion well and is connected to the source line biasing voltage source. The select gate MOS transistor has a drain region of the impurity of the first conductivity type that is the source region of the storage MOS transistor. The threshold voltage of the storage MOS transistor is set to an erased threshold voltage level to erase the nonvolatile memory cell and to a programmed threshold voltage level to program the nonvolatile memory cell.

The nonvolatile memory cell is programmed by Fowler-Nordheim charge tunneling through a gate oxide between the charge storage floating gate and the drain region of the storage MOS transistor. The Fowler-Nordheim charge tunneling is activated to program the nonvolatile memory cell by setting the first well biasing voltage source to a voltage level of from approximately −7.0V to approximately −5.0V and the bit line biasing voltage source to a voltage level of from approximately +5.0V to approximately +7.0V to set the threshold voltage of the storage MOS transistor to the programmed threshold voltage level. The programmed threshold voltage level is from approximately 0.0V to approximately 1.0V.

The nonvolatile memory cell is erased by Fowler-Nordheim charge tunneling through a gate oxide between the erase coupling floating gate and a channel region of the erasing charge coupling MOS transistor set the threshold voltage of the storage MOS transistor to the erased threshold voltage level. The erased threshold voltage level is from approximately +3.0V to approximately +4.0V. The nonvolatile memory cell is erased by setting the first well biasing voltage source to a voltage level of from approximately +5.0V to approximately +7.0V, the second well biasing voltage source to a voltage level of from approximately −7.0V to approximately −5.0V, and the first deep well biasing voltage source to a voltage level of from approximately +5.0V to approximately +7.0V, and the source line biasing voltage source is set to a voltage level of from approximately −7.0V to approximately −5.0V to set the threshold voltage of the storage MOS transistor to the programmed threshold voltage level.

Reading the nonvolatile memory cell detects whether the threshold voltage of the storage MOS transistor is the programmed threshold voltage level or the erased threshold voltage level. In reading the nonvolatile memory cell, the first shallow diffusion well is set to a voltage level that is greater than the programmed threshold voltage level and less than the erased threshold voltage level and the bit line biasing voltage source biasing voltage level is set to approximately +1.0V, the source line biasing voltage source is set to the ground reference voltage level, and the select gate control terminal is set to an activation voltage level to turn on the select gate MOS transistor to read a program state of the nonvolatile memory cell.

BRIEF DESCRIPTION OF THE DRAWINGS

FIG. 1 is a schematic diagram of a single polycrystalline silicon floating gate nonvolatile memory cell of the prior art.

FIG. 2a is a cross sectional diagram of a single polycrystalline silicon floating gate nonvolatile memory cell of this invention.

FIG. 2b is a table illustrating the voltage levels of voltage sources attached to the single polycrystalline silicon floating gate nonvolatile memory cell of the embodiment of FIG. 2a.

FIG. 4a is a cross sectional diagram of a further embodiment of a single polycrystalline silicon floating gate nonvolatile memory cell of this invention.

FIG. 4b is a table illustrating the voltage levels of voltage sources attached to the single polycrystalline silicon floating gate nonvolatile memory cell of the embodiment of FIG. 4a.

FIG. 5 is a cross sectional diagram of still another embodiment of a single polycrystalline silicon floating gate nonvolatile memory cell of this invention.

FIG. 6a is a schematic diagram of the single polycrystalline silicon floating gate nonvolatile memory cell of the embodiment FIG. 2a.

FIG. 6b is a schematic diagram of the single polycrystalline silicon floating gate nonvolatile memory cell of the embodiment of FIG. 3.

FIG. 7a is a cross sectional diagram of even another embodiment of a single polycrystalline silicon floating gate nonvolatile memory cell of this invention.

FIG. 7b is a table illustrating the voltage levels of voltage sources attached to the single polycrystalline silicon floating gate nonvolatile memory cell of the embodiment of FIG. 7a.

FIG. 7c is a schematic diagram of the single polycrystalline silicon floating gate nonvolatile memory cell of the embodiment of FIG. 7a.

FIG. 9a is a cross sectional diagram of still another embodiment of a single polycrystalline silicon floating gate nonvolatile memory cell of this invention.

FIG. 9b is a table illustrating the voltage levels of voltage sources attached to the single polycrystalline silicon floating gate nonvolatile memory cell the embodiment of FIG. 9a.

FIG. 10a is a cross sectional diagram of even still another embodiment of a single polycrystalline silicon floating gate nonvolatile memory cell of this invention.

FIG. 10b is a table illustrating the voltage levels of voltage sources attached to the single polycrystalline silicon floating gate nonvolatile memory cell of the embodiment of FIG. 10a of.

FIG. 11a is a cross sectional diagram of further still another embodiment of a single polycrystalline silicon floating gate nonvolatile memory cell of this invention.

FIG. 11b is a table illustrating the voltage levels of voltage sources attached to the single polycrystalline silicon floating gate nonvolatile memory cell of the embodiment of FIG. 11a.

DETAILED DESCRIPTION OF THE INVENTION

Figures 2A, 2B:
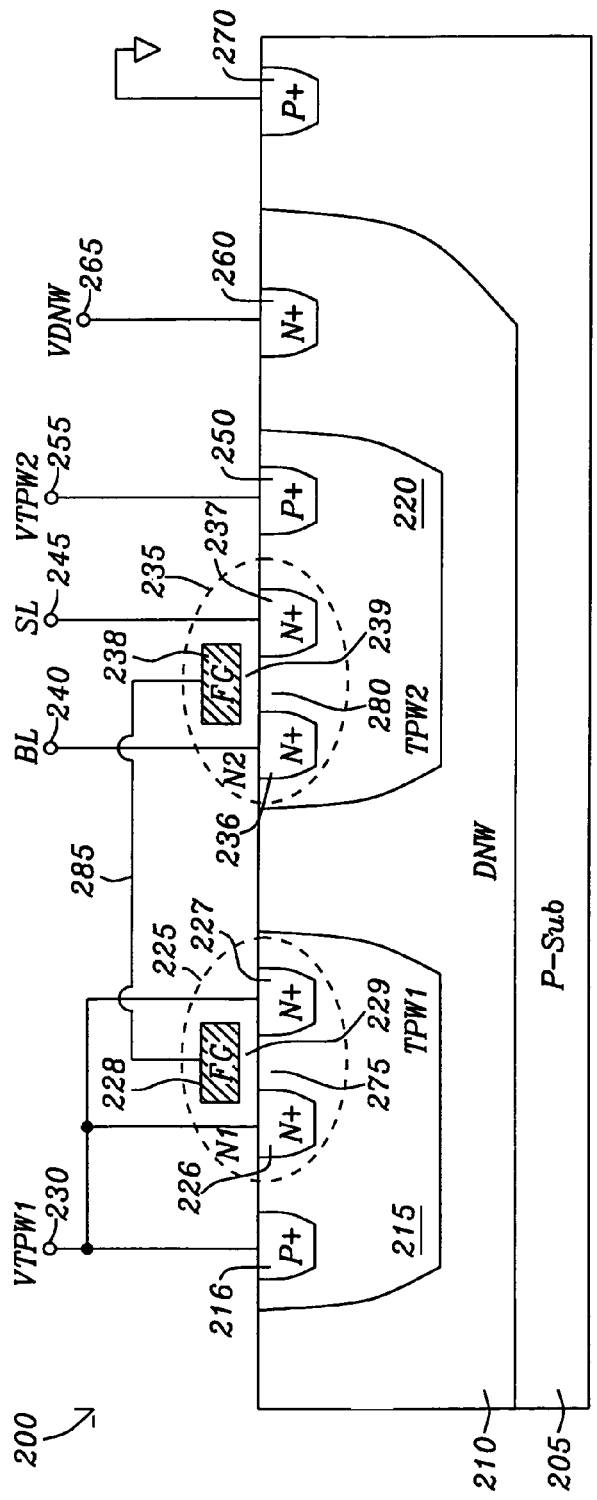

Refer now to FIG. 1 for a description of the schematic diagram of a single polycrystalline silicon floating gate nonvolatile memory cell of Wang et al. Wang et al. provides a single-polycrystalline floating gate one transistor flash cell structure. The NVM cell C100 includes a first programming transistor M106, second programming transistor M104, and storage transistor M102. The pre-charge circuit 108 pre-charges the storage transistor M102 at the beginning of the read operation with a high power supply voltage source VDD. The first programming transistor M106 and the second programming transistor M104 together form the programming element of cell C100. The First programming transistor M106 and the second programming transistor M104 have their gates coupled together and share the floating node 110 with storage transistor M102. A source, a drain, and an n-well terminal of the first programming transistor M106 are coupled together to a first programming voltage VEE. A source, a drain, and an n-well terminal of second programming transistor M104 are coupled together to a second programming voltage VPP.

The floating node 110 stores injected charges of electrons for the purpose of adjusting the cell's 100 threshold voltage (Vt). Increasing the number of electrons stored in floating node 110 increases the threshold voltage of the storage transistor M102. By contrast, decreasing the number of electrons that are stored in floating node 110 decreases the threshold voltage of the storage transistor M102. The size of the first programming transistor M106 is made to be much larger than the total sizes of second programming transistor M104 and the storage transistor M102.

During program operation, Fowler-Nordheim channel tunneling effect is induced on the oxide layer between the channel and gate of second programming transistor M104. The electrons are injected into floating node 110 from second programming voltage source VPP through the first programming transistor M104, to increase the threshold voltage of storage transistor M102 when the second programming voltage source VPP for a program operation. By contrast, during erase operation, a reverse Fowler-Nordheim tunneling effect is induced in gate oxide layer second programming transistor M104 between floating node 110 and N-well node to the second programming voltage source VPP. The electrons are then removed from the floating node 110 to the second programming voltage source VPP through the gate oxide of the second programming transistor M104 which has the thickness less than 100 Å. As a consequence, the threshold voltage of the NMOS storage transistor M102 is reduced after an erase operation.

In the NVM cell structure as described in Wang et al., the programming operation injects electrons into the floating node 110 by placing a high-voltage of +10.0V through the first programming voltage source VEE to the terminal that ties drain, source and n-well of the larger first programming transistor M106 together and the ground reference voltage (0.0V) is applied through the second programming voltage source VPP to the terminal that ties the drain, source and n-well of the smaller second programming transistor M104. The ground reference voltage (0.0V) is applied to the output bit line $V_o$ (BL) and word line voltage source WL that is connected to the source of the NMOS storage transistor M102. Since the first programming transistor M106 is designed to be four to five times larger than the combined sizes of the second programming transistor M104 and the NMOS storage transistor M102, the floating node 110 has a voltage level of about 9.0V. The electrons are attracted to the floating node 110 from the second programming transistor M104 through a Fowler-Nordheim channel tunneling. After the program operation, the threshold voltage of the NMOS storage transistor M102 is increased.

During the erase operation, the high voltage level of approximately +10.0V is applied from the second programming voltage source VPP source, drain, and n-well terminals of the smaller second programming transistor M104. The ground reference voltage (0.0V) is applied to the source, drain, and n-well terminals of the larger first programming transistor M106, the word line voltage source WL and thus the source of the NMOS storage transistor M102, and the output bit line $V_o$ (BL) and thus to the drain of the NMOS storage transistor M102. With the above bias condition, the voltage of floating node 110 is around 1V and voltage drop in the second programming transistor M104 is about 9V between the second programming voltage source VPP and floating node 110. The electrons on floating node 110 are extracted from floating node 110 to the second programming voltage source VPP through second programming transistor M104 by the Fowler-Nordheim channel tunneling effect between the gate and the n-well of the second programming transistor M104. After erase operation, the threshold voltage of the NMOS storage transistor M102 is decreased.

As described Wang et al. is based on Fowler-Nordheim channel tunneling for erase and program. In Wang et al., the single-ploy flash NVM cell C100 has the advantage of low-current program and erase operation. It has a disadvantage of requiring a high-voltage of +10V to effectively perform Fowler-Nordheim channel erase and Fowler-Nordheim channel program. This requirement of +10V is too high thus not available from most of the regular single-poly logic process that only can provide 6.0V breakdown voltage devices.

Therefore, what is needed is a single-polycrystalline floating gate NVM memory cell that is compatible with the single-poly logic device process and a low operating voltage level of a power supply voltage source. This single-polycrystalline floating gate NVM memory cell needs to have program and erase voltages that have a range of voltage of from approximately 6.0V to a voltage less than 10. The single-polycrystalline floating gate NVM memory cell needs to be programmed and erased with very low-current, Fowler Nordheim edge tunneling for programming and erasing. Further, it is needed that the single-polycrystalline floating gate NVM memory cell have a gate oxide thickness less than 100 Å and have a physical size that is smaller than the physical size of the NVM memory cells of the prior art. It should be noted that the single-polycrystalline floating gate is a feature of what is referred to as a Metal Oxide Semiconductor (MOS) transistor. The single polycrystalline floating gate is not metal, but is still a conductor of electrical current. It is common in the art that a field effect transistor having a polycrystalline gate be referred to as a MOS transistor. This usage of MOS transistor is employed through out this description.

Refer now to FIG. 2a for a discussion of the structure of one embodiment of the single polycrystalline silicon floating gate nonvolatile memory cell 200 of this invention. The single polycrystalline silicon floating gate nonvolatile memory cell 200 is formed on a P-type substrate 205. A first deep diffusion well 210 of an N-type impurity is formed in the top surface of the substrate 205. The first deep diffusion well 210 is connected through an N-type contact to a deep well biasing voltage source 265. The P-type substrate is connected to the ground reference voltage source (0.0V) through the contact diffusion 270. The first deep diffusion well 210 is a minor change of adding one process layer to the current single-polycrystalline silicon logic integrated circuit process.

A first shallow diffusion well 215 and a second shallow diffusion well 220 of a P-type impurity are formed within the first deep diffusion well 210. The first and shallow diffusion wells 215 and 220 are additional layers added to the current single-polycrystalline silicon logic integrated circuit process.

A programming charge coupling metal oxide semiconductor (MOS) transistor 225 is connected as a capacitor. The programming charge coupling MOS transistor 225 is formed in the surface of the first shallow diffusion well 215 and has a source region 226 and a drain region 227 of the N-type impurity diffused into the first shallow diffusion well 215. The source region 226, the drain region 227 and the first shallow diffusion well 215 are commonly connected to a first shallow well biasing voltage source VTPW1 230. The P-type diffusion contact 216 connects the first shallow diffusion well 215 to the first shallow well biasing voltage source VTPW1 230. The first shallow diffusion well 215 being connected to the first shallow well biasing voltage source VTPW1 230 through the contact diffusion 216. A program coupling floating gate 228 is formed of a single polycrystalline silicon layer over a gate oxide region 229. The gate oxide region 229 having a material and thickness that is consistent with the commonly used technology for the construction of current CMOS logic technology.

A storage MOS transistor 235 is then formed in the second shallow diffusion well 220. The storage MOS transistor 235 has a N-type drain region 236 and a N-type source region 237 diffused into the second shallow diffusion well 220. The drain region 236 is connected to a bit line voltage source BL 240 and the source region 237 is connected to a source line biasing voltage source 245. A charge storage-floating gate 238 is formed of the single polycrystalline silicon layer over a gate oxide region 239. The gate oxide region 239 having a material and thickness that is consistent with the commonly used technology for the construction of current CMOS logic technology. The second shallow diffusion well 220 is connected to the second shallow well biasing voltage source VTPW2 255 through the contact diffusion 250.

The program and erase operation for the storage MOS transistor 235 is referred to as Fowler-Nordheim tunneling edge-programming. Edge-programming means that the Fowler-Nordheim tunneling effect happens at the edge of the cell near either the drain region 236 or the source region 237 between floating node, rather that at storage MOS transistor's 235 channel region 280. During the edge-program operation, electrons are extracted from the charge storage floating gate 238 into the drain region 236 of the storage MOS transistor 235. In the Fowler-Nordheim tunneling edge-programming, each single polycrystalline silicon floating gate nonvolatile memory cell 200 consumes only a current below 10 nA during program operation.

The coupling ratio of the programming capacitor of the programming charge coupling MOS transistor 225 formed between the program coupling floating gate 228 and the drain region 226, the source region 227, and the channel region 275 and the storage capacitor of the storage MOS transistor 235 formed between the charge storage floating gate 238 and the drain region 236, the source region 237 and the channel region 280 must be very large greater than 80%. To accomplish this, the physical size of the programming charge coupling MOS transistor 225 must be very large in relation to physical size of the storage MOS transistor 235. The size ratio between the programming charge coupling MOS transistor 225 and the storage MOS transistor 235 is greater than 10 times. This large coupling ratio requires that the programming voltages for the storage MOS transistor 235 to be the levels as shown in Table 1:

TABLE 1

| Transistor 235 | Floating Gate 285 | source 236 | drain 237 | VTPW2 220 | NVRAM cell 200 Vt |
|---|---|---|---|---|---|
| FN Edge-Program | −5 V | Floating/0 V | +5 V | 0 V | Vt1 |

Note:
Vt2 > Vt1

In the programming of the floating gate nonvolatile memory cell 200, electrons are extracted from the floating gate node 285 that is the commonly connected program coupling floating gate 228 and the charge storage floating gate 238. The electrons are extracted from the floating gate node 285 to the drain region 236. To accomplish this, the floating gate node 285 must have a voltage level of approximately −5.0V and the drain region 236 must be set to approximately +5.0V for a selected floating gate nonvolatile memory cell 200. The non-selected floating gate nonvolatile memory cells 200 have the drain region 236 set to the ground reference voltage source (0.0V). The second shallow well TPW2 220 and the deep diffusion well 210 are forced to the ground reference voltage source (0.0V). The source region 237 is set to either to be floating or to the ground reference voltage source (0.0V).

Refer now to FIG. 2b for a discussion of the voltage levels that need to be applied to the floating gate nonvolatile memory cell 200 to achieve the conditions as described in Table 1 to have a Fowler-Nordheim tunneling edge programming occur. The first shallow well biasing voltage source VTPW1 230 is set to a voltage of between approximately −6.0V and approximately −7.0V and the bit line voltage source BL 240 is set between approximately +5.0V and approximately +7.0V for selected floating gate nonvolatile memory cells 200. For non-selected floating gate nonvolatile memory cells 200, the bit line voltage source BL 240 is set to the ground reference voltage source (0.0V). The deep well biasing voltage source 265 is set to the ground reference voltage source (0.0V) and the second shallow well biasing voltage source VTPW2 255 and the a source line biasing voltage source 245 are allowed to float or are optionally set to the ground reference voltage source (0.0V).

As described above the physical device size of the programming charge coupling MOS transistor 225 is made sufficiently larger than the storage MOS transistor 235 so that the coupling ratio between the programming capacitor and the storage capacitor is more than 80%. In order to have a programming voltage of approximately −5.0V at the floating gate node 285, the coupling voltage at first shallow well biasing voltage source VTPW1 230 must be from approximately −6.0V to approximately −7.0V. This allows the low-current Fowler-Nordheim tunneling effect to be induced at the edge of the drain region 236. The stored electrons are extracted from the floating gate node 285 into the drain region 236 and thus to the bit line voltage source BL 240. After the Fowler-Nordheim edge-program operation, the threshold voltage Vt2 of the floating gate nonvolatile memory cell 200 is reduced from its erased threshold voltage Vt1, after a predetermined program time period. The erased threshold voltage Vt1 is from approximately +3.0V to approximately +4.0V after erasure and the programmed threshold voltage Vt2 is approximately +1.0V. The erased threshold voltage Vt1 should never be negative to avoid over-erasure into the depletion state for the storage MOS transistor 235. Depending on the thickness of the gate-oxide 239 and the voltage levels of the bit line voltage source BL 240 and the floating gate node 285, the Fowler-Nordheim program time is from a few microseconds to a few milliseconds.

In a read operation, the first shallow well biasing voltage source VTPW1 230 is set to a read detection voltage biasing voltage level ($V_{READ}$) which is then coupled to the floating gate node 285. The read detection voltage ($V_{READ}$) is set between the erased threshold voltage level Vt1 and the programmed threshold voltage level Vt2. The bit line voltage source BL 240 is set to approximately 1.0V. The second shallow well biasing voltage source VTPW2 255 and the source line biasing voltage source 245 are set to the ground reference voltage source (0.0V). The deep well biasing voltage source 265 is set to the voltage level of the power supply voltage source (VDD).

If the floating gate nonvolatile memory cell 200 is programmed, then voltage level at the floating gate node 285 is approximately the level of second threshold level and there would be current conduction flow through the floating gate nonvolatile memory cell 200 from the bit line voltage source BL 240 to the a source line biasing voltage source 245. When the threshold voltage level of the floating gate nonvolatile memory cell 200 is the second threshold voltage level Vt2, the read data is designated as a binary "0". If the floating gate nonvolatile memory cell 200 is not selected to be programmed, then its threshold voltage remains at its erased threshold voltage level Vt1. Therefore the voltage level at the floating gate node 285 is less than the erased threshold voltage level Vt1. When there is no current conduction for floating gate nonvolatile memory cell 200 and the threshold voltage of the floating gate nonvolatile memory cell 200 is the erased threshold level, the binary read data designated as a binary "1".

An advantage of this embodiment of the floating gate nonvolatile memory cell 200 is that the whole erase, program and read operations have a maximum voltage level requirement that is approximately 5.0V which is compatible with the current single-polycrystalline silicon logic integrated circuit process.

Figure 3:
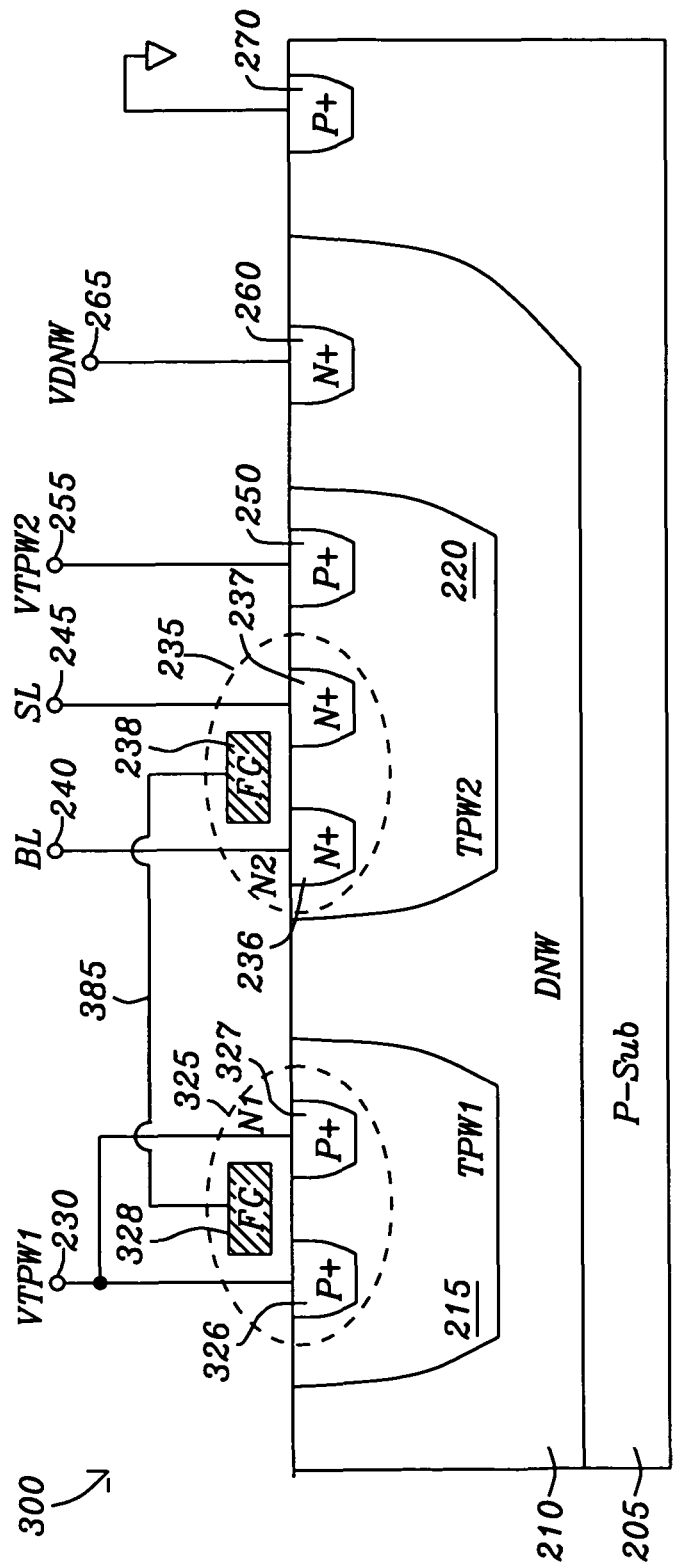
FIG. 3 is a cross sectional diagram of another embodiment of a single polycrystalline silicon floating gate nonvolatile memory cell of this invention.

Refer now to FIG. 3 for a discussion of the structure of another embodiment of the single polycrystalline silicon floating gate nonvolatile memory cell of this invention. The structure of this embodiment is essentially identical to that of FIG. 2a with the exception that the programming charge coupling MOS transistor 225 of FIG. 2a is replaced with a charge coupling MOS capacitor 325. The charge coupling MOS capacitor 325 has two P-type diffusion regions formed in the first shallow diffusion well 215 and is connected to the first well biasing voltage source VTPW1 230. The depth and concentration of the formation of first shallow diffusion well 215 and the second shallow diffusion well 220 are identical their counterparts of FIG. 2a to simplify the complexity of the process steps, thus the cost of the single-poly manufacturing process is reduced and is compatible with the current logic CMOS manufacturing process. The program coupling floating gate 328 is coupled to the charge storage floating gate 238 to form the floating gate node 385.

The charge coupling MOS capacitor 325 and the storage MOS transistor 235 have identical operational biasing conditions to those of the programming charge coupling metal oxide semiconductor (MOS) transistor 225 and the storage MOS transistor 235 of FIG. 2a. As in the floating gate nonvolatile memory cell 200 of FIG. 2a, the floating gate nonvolatile memory cell 300 of this embodiment has the ratio of the device size of charge coupling MOS capacitor 325 to that of the storage MOS transistor 235 that is large enough such that the coupling ratio is greater than 80%.

When the first shallow well biasing voltage source VTPW1 230 is set to the program voltage level of from approximately −7.0V to approximately −5.0V the voltage present at the floating gate node 385 greater than −5.0V during program operation. The resulting extraction of the electrons is equivalent to that described above for FIG. 2a with the biasing voltage level as shown in FIG. 2b.

Figures 4A, 4B:
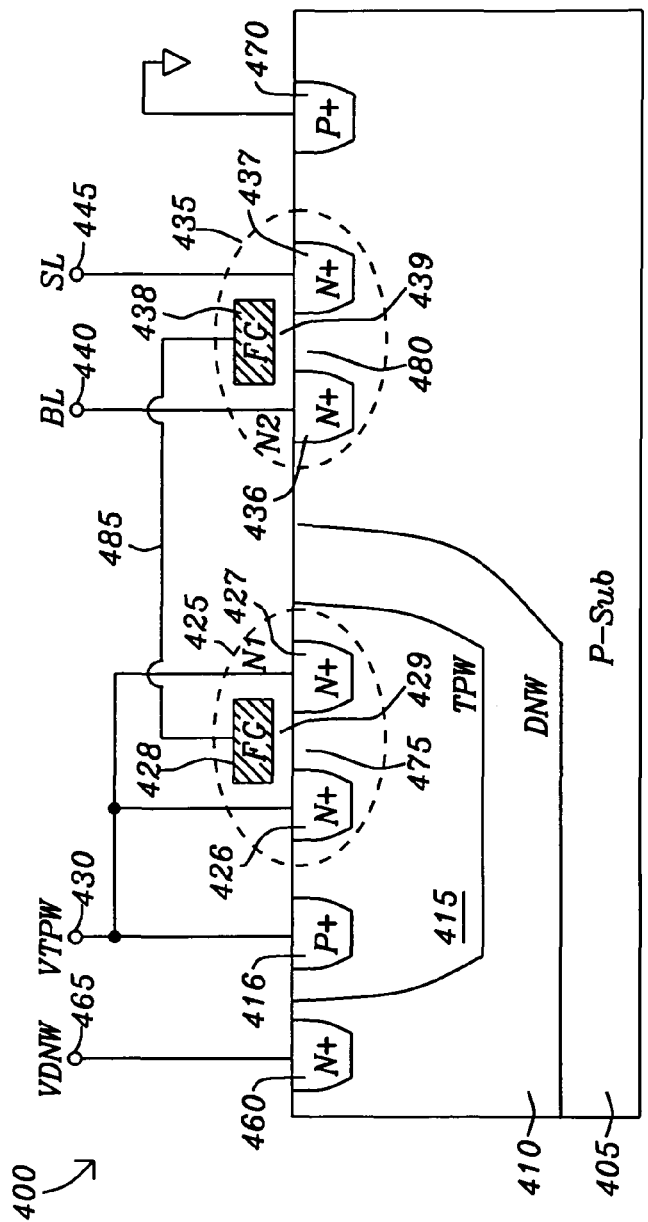

Refer now to FIG. 4a for a discussion of the structure of another embodiment of the single polycrystalline silicon floating gate nonvolatile memory cell of this invention. The single polycrystalline silicon floating gate nonvolatile memory cell 400 is formed on a P-type substrate 405. A first deep diffusion well 410 of an N-type impurity is formed in the top surface of the substrate. The first deep diffusion well 410 is a minor change of adding one process layer to the current single-polycrystalline silicon logic integrated circuit process. The deep diffusion well 410 is connected through an N-type contact to a deep well biasing voltage source 465. The P-type substrate is connected to the ground reference voltage source (0.0V) through the contact diffusion 470.

A shallow diffusion well 415 of a P-type impurity is formed within the deep diffusion well 410. The shallow diffusion wells 415 is an additional layer added to the current single-polycrystalline silicon logic integrated circuit process.

A programming charge coupling metal oxide semiconductor (MOS) transistor 425 is connected as a capacitor. The programming charge coupling MOS transistor 425 is formed in the surface of the shallow diffusion well 415 and has a source region 426 and a drain region 427 of the N-type impurity diffused into the shallow diffusion well 415. The source region 426, the drain region 427 and the shallow diffusion well 415 are commonly connected to a shallow well biasing voltage source VTPW1 430. The shallow diffusion well 415 being connected to the shallow well biasing voltage source VTPW1 430 through the contact diffusion 416. A program coupling floating gate 428 is formed of a single polycrystalline silicon layer over a gate oxide region 429. The gate oxide region 429 having a material and thickness that is consistent with the commonly used technology for the construction of current CMOS logic technology.

A storage MOS transistor 435 is then formed in the P-type substrate 405. The storage MOS transistor 435 has a N-type drain region 436 and a N-type source region 437 diffused into the P-type substrate 405. The drain region 436 is connected to a bit line voltage source BL 440 and the source region 437 is connected to a source line biasing voltage source 445. A charge storage floating gate 438 is formed of the single polycrystalline silicon layer over a gate oxide region 439. The gate oxide region 439 having a material and thickness that is consistent with the commonly used technology for the construction of current CMOS logic technology processing.

The floating gate nonvolatile memory cell 400 of this embodiment differs from the floating gate nonvolatile memory cell 200 of FIG. 2A in that the storage MOS transistor 435 is formed directly, as described above, in the surface of the substrate 405. As in FIG. 2a, the floating gate node 285 is the connection of the programming charge coupling metal oxide semiconductor (MOS) transistor 225 and the storage MOS transistor 235. Since in FIG. 4a, the storage MOS transistor 435 is formed directly in the surface of the substrate, the spacing between storage MOS transistor 435 and the deep diffusion well 410, where the programming charge coupling metal oxide semiconductor (MOS) transistor 425 is located, has to meet the layout design rule for the current CMOS logic technology processing. As in FIG. 2a, the programming charge coupling metal oxide semiconductor (MOS) transistor 425 that is formed in the shallow diffusion well 415 is used as a voltage coupling capacitor during flash program operation. The storage MOS transistor 435 that is formed in the surface of the substrate 405 is the single-poly storage floating-gate device.

The program operation for the storage MOS transistor 435 is a Fowler-Nordheim edge-program to extract electrons from the floating gate nonvolatile memory cell 400. The Fowler-Nordheim edge-program requires voltages similar to those of Table 1 for the read and program operation. The erase operation is accomplished by injecting electrons to the floating gate node 485 and the threshold voltage of the floating gate nonvolatile memory cell 400 is the erased threshold voltage Vt1 (approximately +3.0V to approximately +4.0V).

Referring to FIG. 4b for a table of the biasing voltage levels for the read and program operations of this embodiment, the coupling voltage at shallow well biasing voltage source VTPW 430 must be from approximately −6.0V to approximately −7.0V. This allows the low-current Fowler-Nordheim tunneling effect to be induced at the edge of the drain region 436. The stored electrons are extracted from the floating gate node 485 into the drain region 436 and thus to the bit line voltage source BL 440. After the Fowler-Nordheim edge-program operation, the threshold voltage Vt2 of the floating gate nonvolatile memory cell 400 is reduced from its erased threshold voltage Vt1, after a predetermined program time period. The erased threshold voltage Vt1 is approximately +3.0V to approximately +4.0V after erasure and the programmed threshold voltage Vt2 is approximately +1.0V. The erased threshold voltage Vt1 should never be negative to avoid over-erasure into the depletion state for the storage MOS transistor 435. Depending on the thickness of the gate-oxide 439 and the voltage levels of the bit line voltage source BL 240 and the floating gate node 485, the Fowler-Nordheim program time is from a few microseconds to a few milliseconds.

In a read operation, the shallow well biasing voltage source VTPW 430 is set to a read detection voltage ($V_{READ}$) biasing voltage level which is then coupled to the floating gate node 485. The read detection voltage ($V_{READ}$) is set between the erased threshold voltage level Vt1 and the programmed threshold voltage level Vt2. The bit line voltage source BL 440 is set to approximately 1.0V. The P-type substrate and the source line biasing voltage source 445 are set to the ground reference voltage source (0.0V). The deep well biasing voltage source 465 is set to the voltage level of the power supply voltage source (VDD).

If the floating gate nonvolatile memory cell 400 is programmed, then voltage level at the floating gate node 485 is approximately the level of second threshold level and there would be current conduction flow through the floating gate nonvolatile memory cell 400 from the bit line voltage source BL 440 to the a source line biasing voltage source 445. When the threshold voltage level of the floating gate nonvolatile memory cell 400 is the second threshold voltage level Vt2, the read data is designated as a binary "0". If the floating gate nonvolatile memory cell 400 is not selected to be programmed, then its threshold voltage remains at its erased threshold voltage level Vt1. Therefore the voltage level at the floating gate node 485 is less than the erased threshold voltage level Vt1. When there is no current conduction for floating gate nonvolatile memory cell 400 and the threshold voltage of the floating gate nonvolatile memory cell 400 is the erased threshold level, the binary read data designated as a binary "1".

Refer now to FIG. 5 for a discussion of the structure of another embodiment of the single polycrystalline silicon floating gate nonvolatile memory cell of this invention. The structure of this embodiment is essentially identical to that of FIG. 4a with the exception that the programming charge coupling MOS transistor 225 of FIG. 2a is replaced with a charge coupling MOS capacitor 525. The charge coupling MOS capacitor 525 is identical to that of FIG. 3 where the charge coupling MOS capacitor 525 has two P-type diffusion regions formed in the first shallow diffusion well 215 and is connected to the first well biasing voltage source VTPW 430. The depth and concentration of the formation of shallow diffusion well 415 is identical its counterparts of FIG. 3 to simplify the complexity of the process steps, thus the cost of the single-poly manufacturing process is reduced and is compatible with the current logic CMOS manufacturing process. The program coupling floating gate 528 is coupled to the charge storage floating gate 438 to form the floating gate node 585.

The charge coupling MOS capacitor 525 and the storage MOS transistor 435 have identical operational biasing conditions to those of the programming charge coupling metal oxide semiconductor (MOS) transistor 425 and the storage MOS transistor 435 of FIG. 4a. As in the floating gate nonvolatile memory cell 400 of FIG. 4a, the floating gate nonvolatile memory cell 500 of this embodiment has the ratio of the device size of charge coupling MOS capacitor 525 to that of the storage MOS transistor 435 that is large enough such that the coupling ratio is greater than 80%.

When the shallow well biasing voltage source VTPW 430 is set to the program voltage level of from approximately −7.0V to approximately −5.0V the voltage present at the floating gate node 585 greater than −5.0V during program operation. The resulting extraction of the electrons is equivalent to that described above for FIG. 4a with the biasing voltage level as shown in FIG. 4b.

FIG. 6a illustrates the schematic diagram for FIG. 2a and FIG. 4a. The schematic is explained with reference to FIG. 2a, but it will obvious to one skilled in the art that the details of FIG. 5 with respect to the schematic are identical. The floating gate nonvolatile memory cell 200 includes the programming charge coupling MOS transistor 225 that is connected as a MOS capacitor and the storage MOS transistor 235 that is connected as the charge storage device. The program coupling floating gate 228 and the charge storage floating gate 238 are commonly connected to form the floating gate node 285. The source, drain, and the bulk (the first shallow diffusion well) of the programming charge coupling MOS transistor 225 are connected to the first shallow well biasing voltage source VTPW1 230. The drain of the storage MOS transistor 235 is connected to the bit line voltage source BL 240. The source of the storage MOS transistor 235 is connected to the source line biasing voltage source 245. The second shallow diffusion well that is the bulk of the storage MOS transistor 235 is connected to the second shallow well biasing voltage source VTPW2. It is to be noted that in FIG. 4a the storage MOS transistor 435 is formed in the surface of the substrate 405. In that embodiment there is not need for the second shallow well biasing voltage source VTPW2.

FIG. 6b illustrates the schematic diagram for FIGS. 3 and 5. The schematic is explained with reference to FIG. 3 but it will obvious to one skilled in the art that the details of FIG. 5 with respect to the schematic are identical. The structure of the floating gate nonvolatile memory cell 300 of this embodiment is essentially identical to that of FIG. 2a with the exception that the programming charge coupling MOS transistor 225 of FIG. 2a is replaced with a charge coupling MOS capacitor 325. The program coupling floating gate 328 and the charge storage floating gate 238 are commonly connected to form the floating gate node 385. The two P-type diffusion regions are connected to the first shallow well biasing voltage source VTPW1 230. As in FIG. 2a, the drain of the storage MOS transistor 235 is connected to the bit line voltage source BL 240. The source of the storage MOS transistor 235 is connected to the source line biasing voltage source 245. The second shallow diffusion well that is the bulk of the storage MOS transistor 235 is connected to the second shallow well biasing voltage source VTPW2. It is to be noted that in FIG. 5 the storage MOS transistor 435 is formed in the surface of the substrate 405. In that embodiment there is not need for the second shallow well biasing voltage source VTPW2.

Figure 6C:
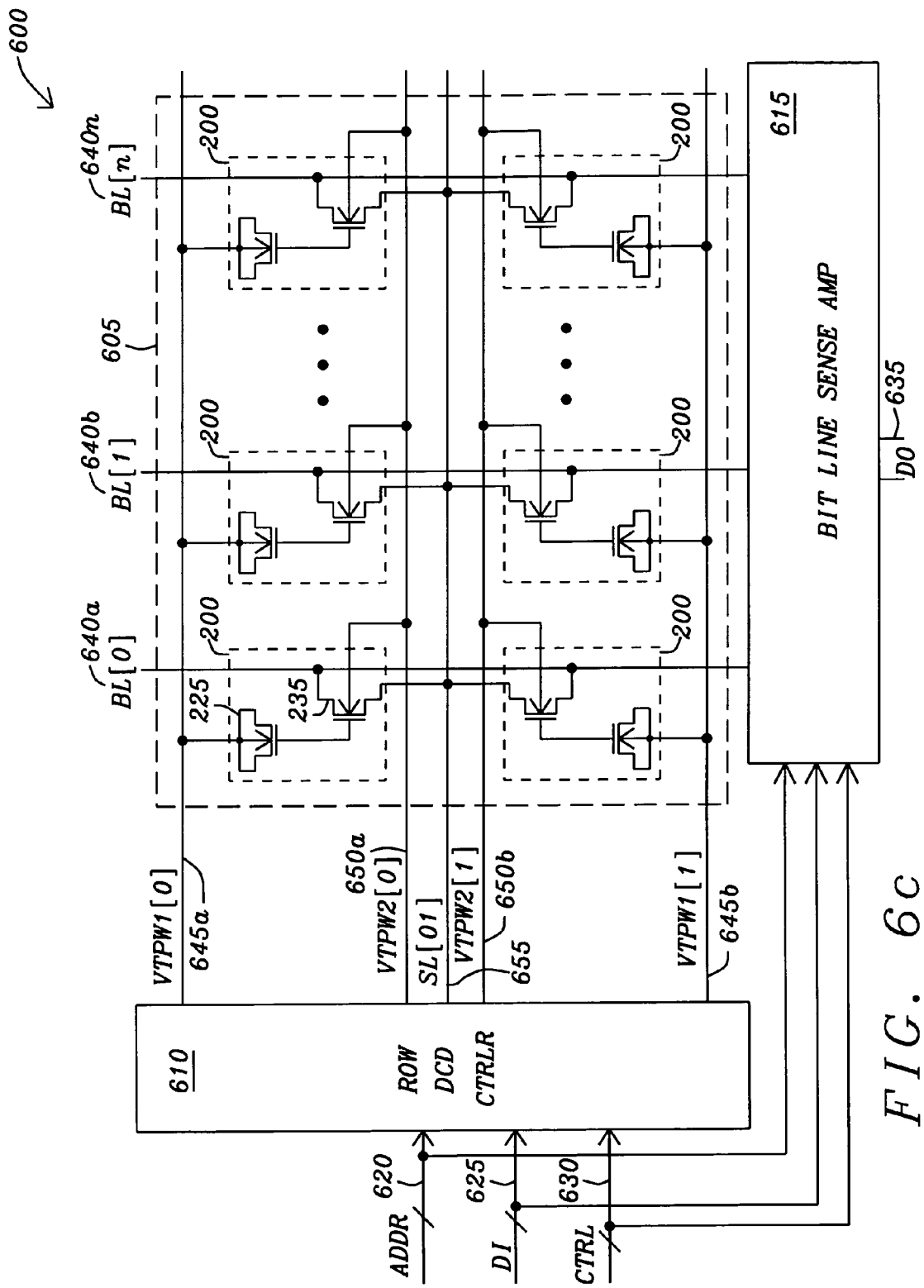
FIG. 6c is schematic diagram of an array of the embodiment of FIG. 2a of the single polycrystalline silicon floating gate nonvolatile memory cells of this invention.

FIG. 6c illustrates a nonvolatile memory device 600 that includes an array 605 of the floating gate nonvolatile memory cells 200 of FIG. 6a. It will be obvious to one skilled in the art that the array 605 of floating gate nonvolatile memory cells 200 could be replaced with the floating gate nonvolatile memory cell 300 of FIG. 6b with appropriate modifications. As described in FIG. 6a, each of the floating gate nonvolatile memory cells 200 has a programming charge coupling MOS transistor 225 and a storage MOS transistor 235. The drain, source, and bulk of the programming charge coupling MOS transistor 225 are connected to the first shallow well biasing voltage sources VTPW1 [0] 645a, ..., VTPW1 [1] 645b for each row of the array 605. Each bit line BL[0] 640a, BL[1] 640b, ..., BL[n] 640n is connected to the drain of each storage MOS transistor 235 of each of the floating gate nonvolatile memory cells 200 of an associated column of the array 605. The bulk region of each row of the storage MOS transistors 235 on each row is connected to an associated second shallow well biasing voltage sources VTPW2 [0] 650a, ..., VTPW2 [1] 650b. The source lines of each row of the storage MOS transistors 235 are connected to an associated source line biasing voltage source 655.

The bit lines BL[0] 640a, BL[1] 640b, BL[n] 640n are connected to the bit line sense amplifier 615 which includes the bit line voltage sources necessary for providing the necessary biasing voltages for programming and reading the floating gate nonvolatile memory cells 200. Further, the bit line sense amplifier 615 contains sense amplifier circuits which sense the data state of selected floating gate nonvolatile memory cells 200 in a read operation and provide the sensed data at the data output port 635.

The row decode controller 610 contains the first shallow well biasing voltage sources VTPW1 [0] 645a, ..., VTPW1 [1] 645b, the second shallow well biasing voltage sources VTPW2 [0] 650a, VTPW2 [1] 650b, and the source line biasing voltage source 655. The address signals, 620, the data 625, and the control signals 630 are appropriately decoded and routed to the row decode controller 610 and the bit line sense amplifier 615 to establish the necessary control and biasing voltages for programming and reading the selected floating gate nonvolatile memory cells 200 of the array 605.

Figures 7A, 7B:
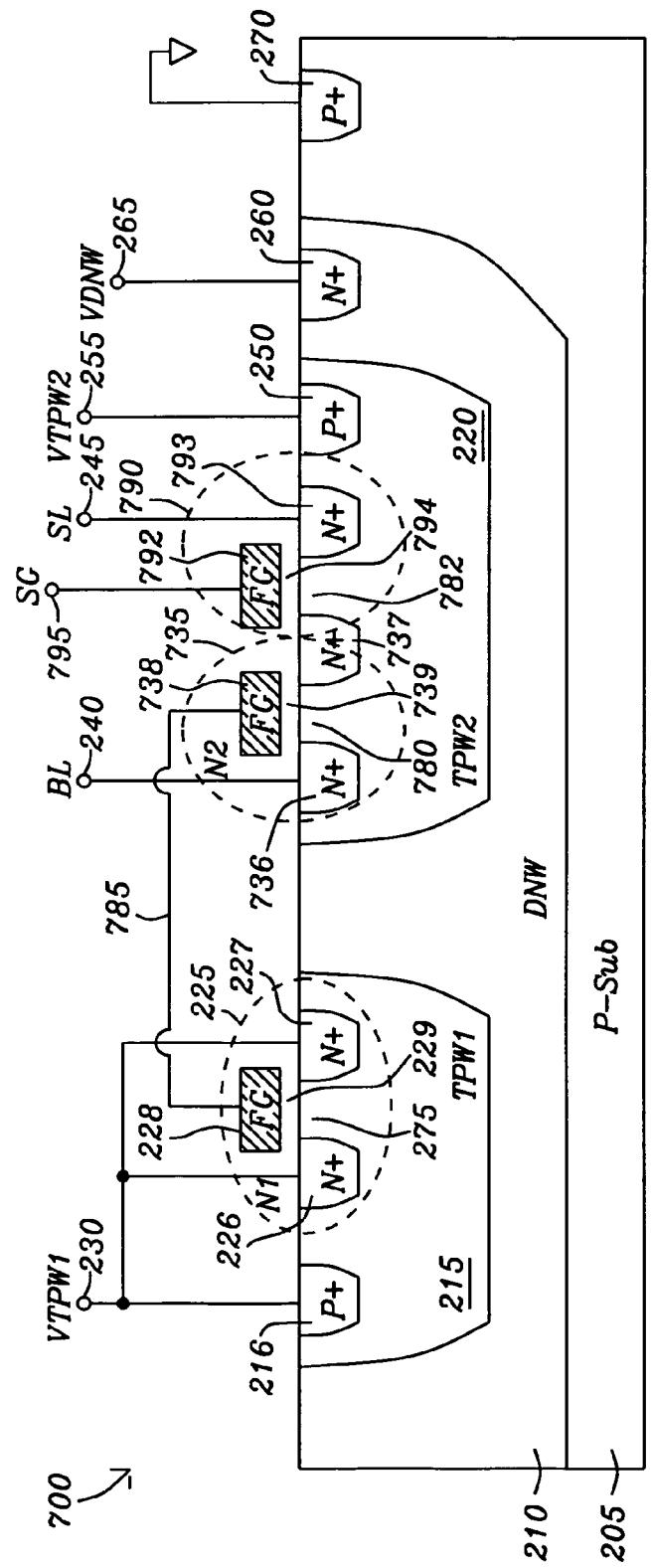

Refer now to FIG. 7a for a discussion of the structure of another embodiment of the single polycrystalline silicon floating gate nonvolatile memory cell 700 of this invention. The structure of this embodiment is essentially identical in structure and function to that of FIG. 2a with the exception of the addition of a select gating transistor 790. In this embodiment, the program coupling floating gate 228 and the charge storage floating gate 238 are commonly connected to form the floating gate node 785.

The storage MOS transistor 735 is then formed, as described above for the storage MOS transistor 235 of FIG. 2a, in the second shallow diffusion well 220. The storage MOS transistor 735 has a N-type drain region 736 and a N-type source region 737 diffused into the second shallow diffusion well 220. The drain region 736 is connected to a bit line biasing voltage source 240. A charge storage floating gate 738 is formed of the single polycrystalline silicon layer over a gate oxide region 739. The gate oxide region 739 having a material and thickness that is consistent with the commonly used technology for the construction of current CMOS logic technology.

The select gating transistor 790 is simultaneously formed in the second shallow diffusion well 220. A PN-type source region 793 is diffused into the second shallow diffusion well 220. The drain region of the select gating transistor 790 is the source region of the storage MOS transistor 735 that is a PN-type impurity diffused into the second shallow diffusion well 220. The source of the select gating transistor 790 is connected to the source line voltage source SL 245. A select gate 792 is formed of the single polycrystalline silicon layer over a gate oxide region 794 and connected to a select gating control signal 795. The select gating transistor 790 provides control for connecting the storage MOS transistor 735 to the source line 245 during programming and reading operations.

The program and erase operation for the storage MOS transistor 735 is Fowler-Nordheim tunneling edge-programming as described in FIGS. 2a and 2b. The coupling ratio of the programming capacitor of the programming charge coupling MOS transistor 225 and the storage capacitor of the storage MOS transistor 735 must be very large greater than 80%. To accomplish this, the physical size of the programming charge coupling MOS transistor 225 must be very large in relation to physical size of the storage MOS transistor 735. The size ratio between the programming charge coupling MOS transistor 225 and the storage MOS transistor 735 is greater than ten times.

Refer now to FIG. 7b for a discussion of the voltage levels that need to be applied to the floating gate nonvolatile memory cell 700 to achieve the conditions as described in Table 1 to have a Fowler-Nordheim tunneling edge programming occur. The first shallow well biasing voltage source VTPW1 230 is set to a voltage of between approximately −6.0V and approximately −7.0V and the bit line voltage source BL 240 is set between approximately +5.0V and approximately +7.0V for selected floating gate nonvolatile memory cells 700. For non-selected floating gate nonvolatile memory cells 700, the bit line voltage source BL 240 is set to the ground reference voltage source (0.0V). The deep well biasing voltage source 265 is set to the ground reference voltage source (0.0V) and the second shallow well biasing voltage source VTPW2 255 and the a source line biasing voltage source 245 are allowed to float or are optionally set to the ground reference voltage source (0.0V). The select gating control signal 795 is set to a voltage level of the ground reference voltage source (0.0V) to deactivate the select gating transistor 790. This permits the source region 737 to be floating during a programming operation and the charge extracted from the program coupling floating gate 228 into the drain region 236 of the storage MOS transistor 235.

As described above the physical device size of the programming charge coupling MOS transistor 225 is made sufficiently larger than the storage MOS transistor 235 so that the coupling ratio between the programming capacitor and the storage capacitor is more than 80%. In order to have a programming voltage of approximately −5.0V at the floating gate node 785, the coupling voltage at first shallow well biasing voltage source VTPW1 230 must be from approximately −6.0V to approximately −7.0V. This allows the low-current Fowler-Nordheim tunneling effect to be induced at the edge of the drain region 236. The stored electrons are extracted from the floating gate node 785 into the drain region 236 and thus to the bit line voltage source BL 240. After the Fowler-Nordheim edge-program operation, the threshold voltage Vt2 of the floating gate nonvolatile memory cell 700 is reduced from its erased threshold voltage Vt1, after a predetermined program time period. The erased threshold voltage Vt1 is approximately +3.0V to approximately +4.0V after erasure and the programmed threshold voltage Vt2 is approximately +1.0V. The erased threshold voltage Vt1 should never be negative to avoid over-erasure into the depletion state for the storage MOS transistor 235. Depending on the thickness of the gate-oxide 239 and the voltage levels of the bit line voltage source BL 240 and the floating gate node 785, the Fowler-Nordheim program time is from a few microseconds to a few milliseconds.

In a read operation, the first shallow well biasing voltage source VTPW1 230 is set to a read detection voltage ($V_{READ}$) biasing voltage level which is then coupled to the floating gate node 785. The read detection voltage ($V_{READ}$) is set between the erased threshold voltage level Vt1 and the programmed threshold voltage level Vt2. The bit line voltage source BL 240 is set to approximately 1.0V. The second shallow well biasing voltage source VTPW2 255 and the source line biasing voltage source 245 are set to the ground reference voltage source (0.0V). The deep well biasing voltage source 265 is set to the voltage level of the power supply voltage source (VDD).

If the floating gate nonvolatile memory cell 700 is programmed, the voltage level at the floating gate node 785 is approximately the level of second threshold level and there would be current conduction flow through the floating gate nonvolatile memory cell 700 from the bit line voltage source BL 240 to the a source line biasing voltage source 245. When the threshold voltage level of the floating gate nonvolatile memory cell 700 is the second threshold voltage level Vt2, the read data is designated as a binary "0". If the floating gate nonvolatile memory cell 700 is not selected to be programmed, then its threshold voltage remains at its erased threshold voltage level Vt1. Therefore the voltage level at the floating gate node 785 is less than the erased threshold voltage level Vt1. When there is no current conduction for floating gate nonvolatile memory cell 700 and the threshold voltage of the floating gate nonvolatile memory cell 700 is the erased threshold level, the binary read data designated as a binary "1".

One major concern for operation of the single transistor floating gate nonvolatile memory cell 200 of FIG. 2A is the over-erased negative threshold voltage of the storage MOS transistor 235 during the Fowler-Nordheim edge-program operation. If there is a negative threshold voltage of any storage MOS transistor 235 in an array, it may result in the wrong sensing of the data in the normal read operation. The addition of the select gating transistor 790 to form the "two-transistor" floating gate nonvolatile memory cell 700 eliminates any over-erase concerns during the program operation. The select gating transistor 790 blocks any leakage current from unselected floating gate nonvolatile memory cells 700 during a read operation.

Figure 7C:
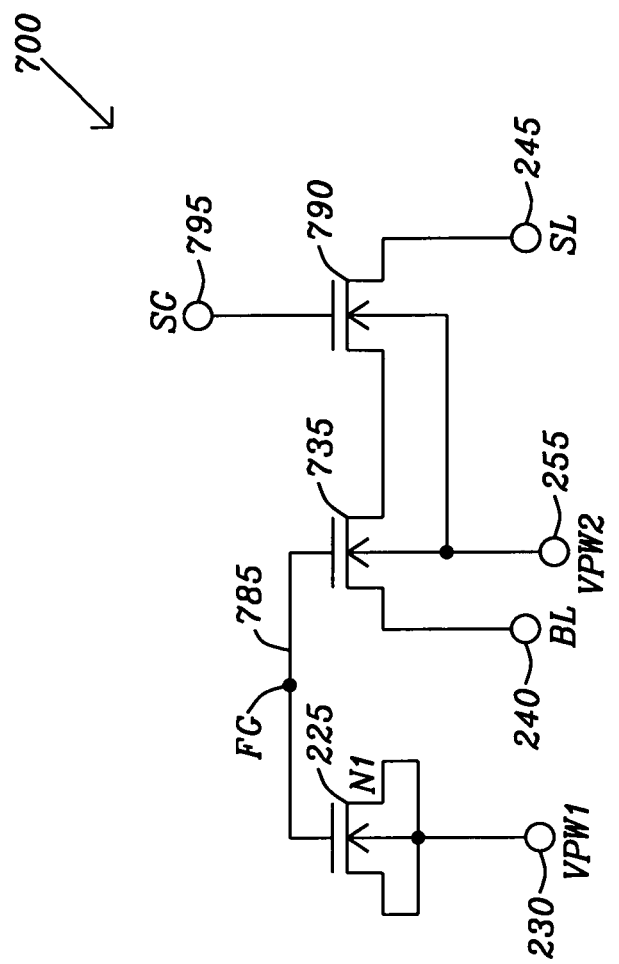

FIG. 7c is a schematic diagram of the floating gate nonvolatile memory cell 700 described in FIG. 7a. The coupling capacitor is a programming charge coupling MOS transistor 225 as described above. The bulk of storage MOS transistor 735 and select gating transistor 790 is connected commonly to the second shallow well biasing voltage source VTPW2 255. In a structure similar to that of FIG. 4a, the storage MOS transistor 735 and select gating transistor 790 may be formed directly in the substrate 205. The programming charge coupling MOS transistor 225 is then eliminated and the bulk of the storage MOS transistor 735 and select gating transistor 790 are tied directly to the ground reference voltage source (0.0V) through the substrate 205.

A disadvantage of floating gate nonvolatile memory cell 700 of this embodiment over the floating gate nonvolatile memory cell 200 of the embodiment of FIG. 2 is the increase in the cell size. But because the dominant factor of floating gate nonvolatile memory cell of this invention is the large spacing between the programming charge coupling MOS transistor 225 and the storage MOS transistor 735. The area overhead to add the select gating transistor 790 to the storage MOS transistor 735 in the floating gate nonvolatile memory cell 700 is negligible.

Figure 8A:
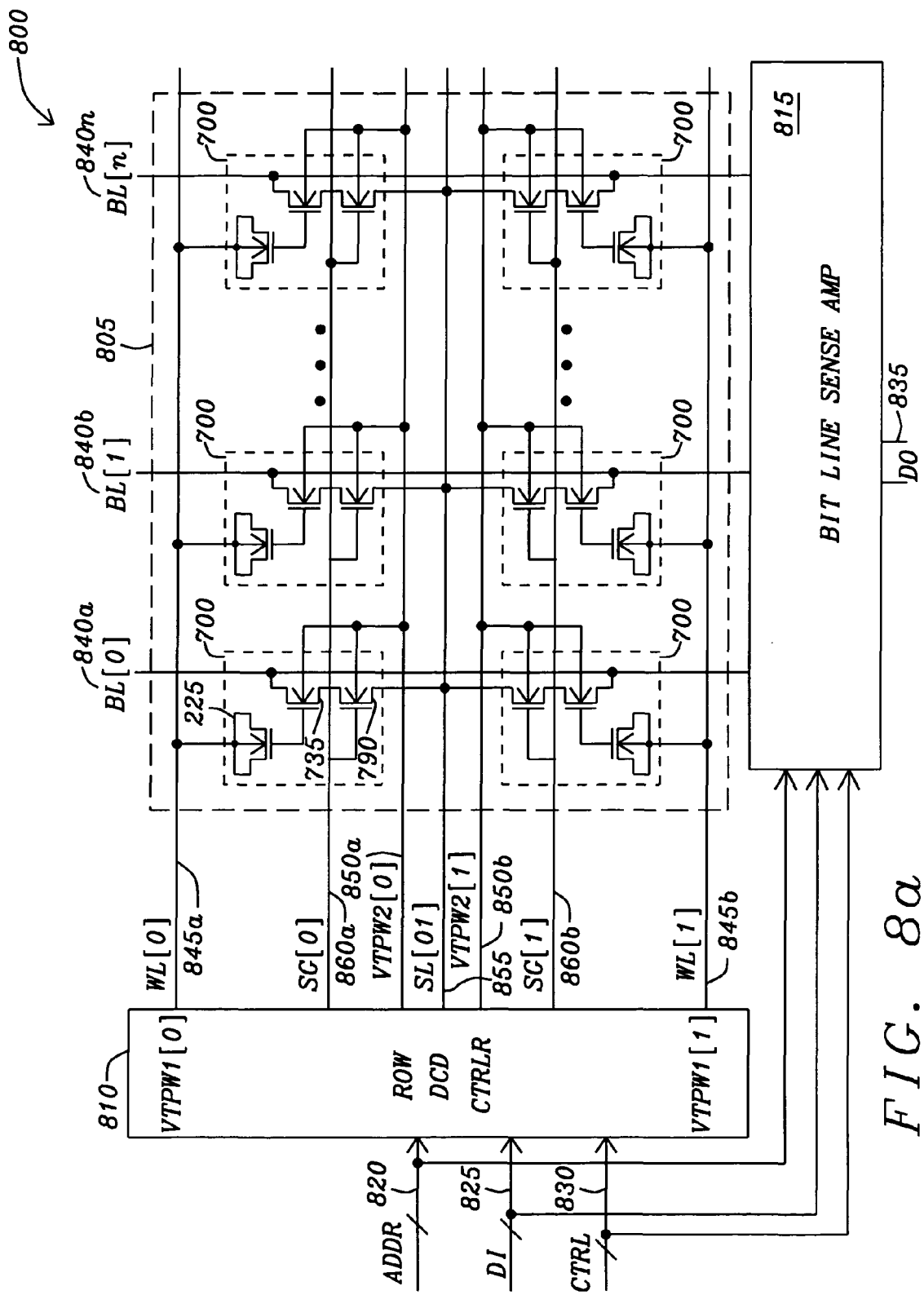
FIG. 8a is schematic diagram of an array of the embodiment of FIG. 7a of the single polycrystalline silicon floating gate nonvolatile memory cells of this invention.

FIG. 8a illustrates a nonvolatile memory device 800 that includes an array 805 of the floating gate nonvolatile memory cells 700 of FIG. 7c. As described in FIG. 7c, each of the floating gate nonvolatile memory cells 700 has a programming charge coupling MOS transistor 225, a storage MOS transistor 735 and a select gating transistor 790. The drain, source, and bulk of the programming charge coupling MOS transistor 225 are connected to the word lines WL [0] 845a, WL [1] 845b that are connected to the first shallow well biasing voltage sources VTPW1 for each row of the array 805. Each bit line BL[0] 840a, BL[1] 840b, BL[n] 840n is connected to a drain of the storage MOS transistor 735 of a floating gate nonvolatile memory cells 700 of an associated column of the array 805. The bulk region of each row of the storage MOS transistors 735 and the select gating transistor 790 of the floating gate nonvolatile memory cells 700 on each row is connected to an associated second shallow well biasing voltage sources VTPW2 [0] 850a, VTPW2 [1] 850b. The source lines of each row of the select gating transistor 790 are connected to an associated source line biasing voltage source 855. The select gate 792 of each of the select gating transistors 790 of each row of the storage MOS transistors 735 is connected to an associated select gating control signals SG [0] 860a, . . . , SG [1] 860b.

The bit lines are connected to the bit line sense amplifier 815 which includes the bit line voltage sources necessary for providing the necessary biasing voltages for programming and reading the floating gate nonvolatile memory cells 700. Further, the bit line sense amplifier 815 contain sense amplifier circuits which sense the data state of selected floating gate nonvolatile memory cells 700 in a read operation and provide the sensed data at the data output port 835.

The row decode controller 810 contains the first shallow well biasing voltage sources that are connected to the word lines WL [0] 845a, . . . , WL [1] 845b, the second shallow well biasing voltage sources VTPW2 [0] 850a, . . . , VTPW2 [1]

850b, select gating control signals SG [0] 860a, ..., SG [1] 860b, and the source line biasing voltage source 855. Further, the address signals, 820, the data signals 825, and the control signals 830 are appropriately decoded and routed to the row decode controller 810 and the bit line sense amplifier 815 to establish the necessary control and biasing voltages for programming and reading the selected floating gate nonvolatile memory cells 700 of the array 805.

Figure 8B:
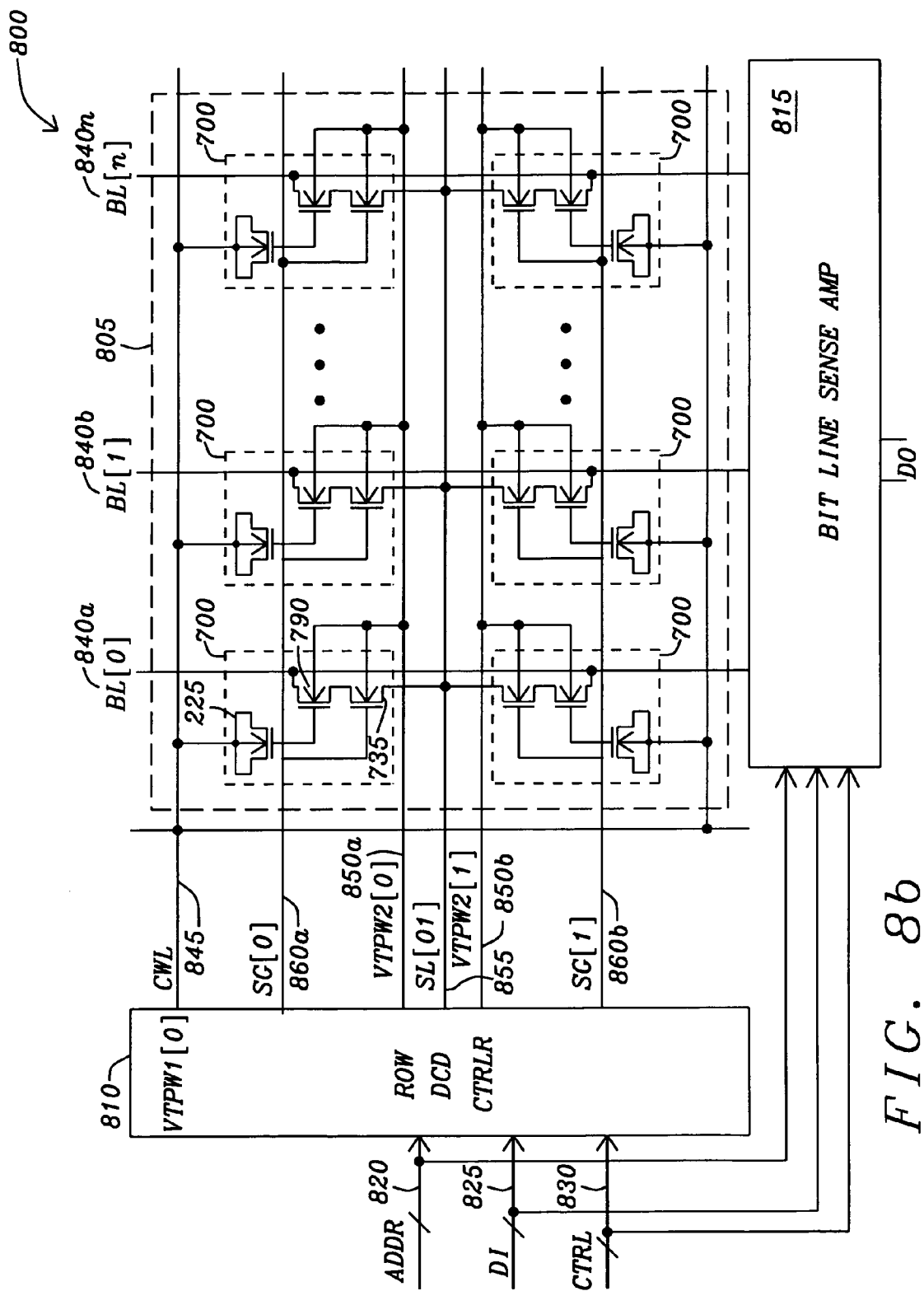
FIG. 8b is schematic diagram of another array of the embodiment of FIG. 7a of the single polycrystalline silicon floating gate nonvolatile memory cells of this invention.

FIG. 8b illustrates a nonvolatile memory device 800 that includes an array 805 of the floating gate nonvolatile memory cells 700 of FIG. 7c. In this embodiment, the structure of the floating gate nonvolatile memory cells 700 is essentially inverted where the drain of the select gating transistor 790 of each of the floating gate nonvolatile memory cells 700 on a column of the floating gate nonvolatile memory cells 700 is connected to a bit line BL[0] 840a, BL[1] 840b, ..., BL[n] 840n.

The drain, source, and bulk of each of the programming charge coupling MOS transistors 225 within the array 805 all are connected to the common word lines CWL 845 that is connected to the first shallow well biasing voltage source VTPW1. The advantage of array 805 of the floating gate nonvolatile memory cells 700 of this embodiment over the embodiment of FIG. 8A is a savings in physical area for the array 805.

The source of each of the select gating transistors 790 is connected to a drain of each of the storage MOS transistors 735 of the floating gate nonvolatile memory cells 700. The bulk region of each row of the storage MOS transistors 225 of the floating gate nonvolatile memory cells 700 on each row is connected to an associated second shallow well biasing voltage sources VTPW2 [0] 850a, ..., VTPW2 [1] 850b. The source lines of each row of the storage MOS transistors 735 are connected to an associated source line SL[01] to receive a source line biasing voltage 855 from the row decode controller 810. The select gate 792 of each of the select gating transistors 790 of each row of the storage MOS transistors 235 is connected to an associated select gating control signals SG [0] 860a, ..., SG [1] 860b The bit lines are connected to the bit line sense amplifier 815 which includes the bit line voltage sources necessary for providing the necessary biasing voltages for programming and reading the floating gate nonvolatile memory cells 700. Further, the bit line sense amplifier 815 contains sense amplifier circuits which sense the data state of selected floating gate nonvolatile memory cells 700 in a read operation and provide the sensed data at the data output port 835.

The row decode controller 810 contains the first shallow well biasing voltage sources that are connected to the word lines WL [0] 845a, WL [1] 845b, the second shallow well biasing voltage sources VTPW2 [0] 850a, VTPW2 [1] 850b, select gating control signals SG [0] 860a, ..., SG [1] 860b, and the source line biasing voltage source 855. Further, the address signals, 820, the data 825, and the control signals 830 are appropriately decoded and routed to the row decode controller 810 and the bit line sense amplifier 815 to establish the necessary control and biasing voltages for programming and reading the selected floating gate nonvolatile memory cells 700 of the array 805.

In all the above described embodiments of the present invention, the program operation uses Fowler-Nordheim edge tunneling to reduce the threshold voltage of the storage MOS transistor. In a one-time programmable single polycrystalline silicon floating gate nonvolatile memory cell, the erase operation relies on the exposure to ultra-violet light for erasure. This ultra-violet light erasure has a large drawback for the single polycrystalline silicon floating gate nonvolatile memory cells of this invention. A repeat program and erase capability within a system is not possible if the module package containing the array of floating gate nonvolatile memory cells is sealed to block the ultra-violet light. Without specialized erasing and programming devices, the data stored within the sealed package can not be altered again in a system. Therefore, what is needed is a floating gate nonvolatile memory cell that incorporates the capability for programming and erasure in the device. Unlike a one-time programmable single polycrystalline silicon floating gate nonvolatile memory cell, the program/erase endurance cycles of this invention is more than one thousand.

Figures 9A, 9B:
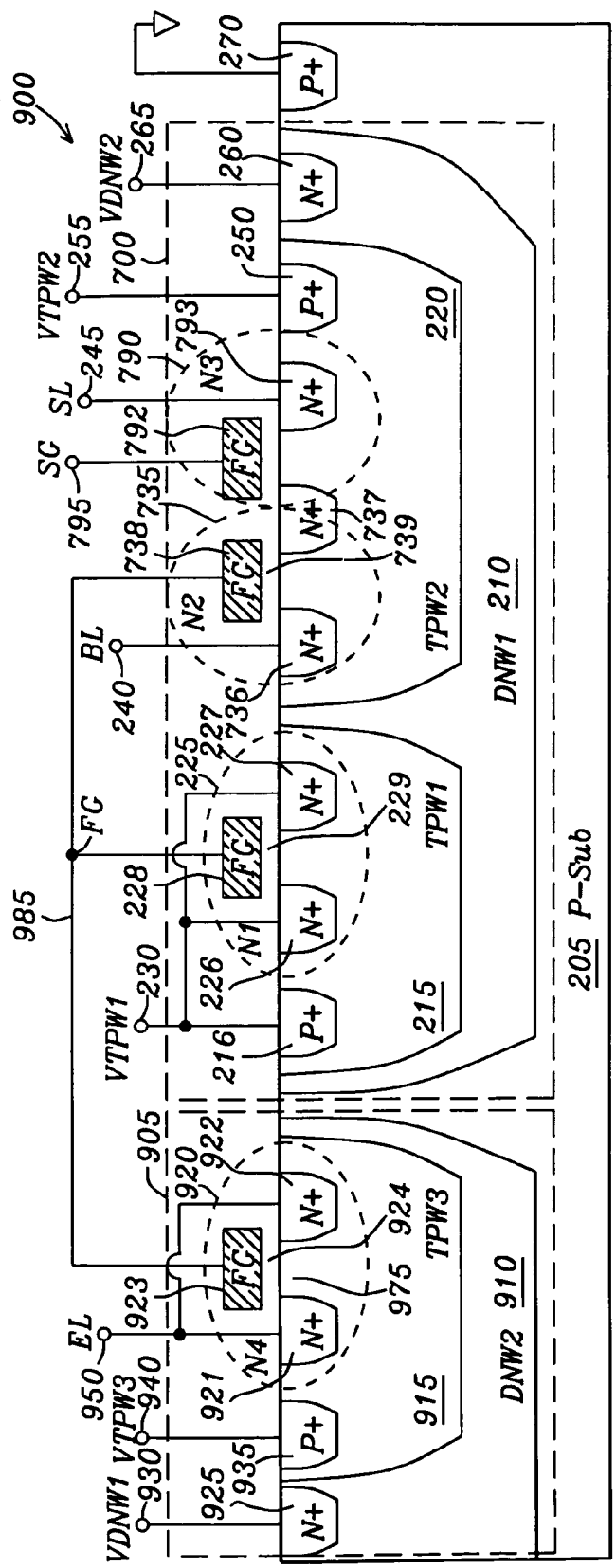

FIG. 9a provides a cross sectional diagram that illustrates still another embodiment of a single polycrystalline silicon floating gate nonvolatile memory cell 900 of this invention with the capability for electrical programming and erasure to eliminate any requirement for ultra-violet light erasing. The programming and charge storage device 700 has the programming charge coupling MOS transistor 225, the storage MOS transistor 735, and select gating transistor 790 is structured and functions as described in FIGS. 7a and 7b. The erasing element 905 is formed in a third shallow diffusion well 915 that is a P-type material. The third shallow diffusion well 915 is formed in a second deep diffusion well 910 that is formed of an N-type material diffused into the surface of the substrate 205. The first deep diffusion well 910 is a minor change of adding one process layer to the current single-polycrystalline silicon logic integrated circuit process. The erasing charge coupling MOS transistor 920 is formed when an N-type source diffusion 921 and an N-type drain diffusion 922 are diffused into the third shallow diffusion well 915. The N-type source diffusion 921 and the N-type drain diffusion 922 are commonly connected to the erase control line EL 950.

An erase coupling floating gate 923 is formed of a single polycrystalline silicon layer over a gate oxide region 924. The gate oxide region 924 having a material and thickness that is consistent with the commonly used technology for the construction of current CMOS logic technology. The erase coupling floating gate 923 is commonly connected with the program coupling floating gate 228, the charge storage floating gate 238 to form the floating gate node 985.

The second deep diffusion well 910 is connected through the contact diffusion 925 to a second deep well biasing voltage source 930. The P-type diffusion contact 935 connects the third shallow diffusion well 915 to the third shallow well biasing voltage source VTPW3 940. The P-type substrate is connected to the ground reference voltage source (0.0V) through the contact diffusion 270.

The floating gate nonvolatile memory cell 900 is erased by a Fowler-Nordheim channel tunneling. Fowler-Nordheim channel tunneling requires a higher voltage level to successfully perform the program and erase operation than the Fowler-Nordheim edge tunneling for a program as described for the above embodiments. Table 2 provides a comparison of the voltage requirements for the Fowler-Nordheim channel tunneling and the Fowler-Nordheim edge tunneling for the floating gate nonvolatile memory cell 900 is shown below.

TABLE 2

| Transistor 735 | Floating Gate 985 | source 736 | drain 737 | VTPW2 220 |
|---|---|---|---|---|
| FN Edge-program | +5 V | 0 V | −5 V | 0 V |
| FN channel-program | +7 V | +7 V | −7 V | +7 V |
| FN channel-erase | −7 V | −7 V | +7 V | −7 V |

The table of FIG. 9b provides the voltage levels necessary for the program the floating gate nonvolatile memory cell 900 of this embodiment. The erasing charge coupling MOS transistor 920 injects electrons from its channel of third shallow diffusion well 915 to the erase coupling floating gate 923 and thus to the floating gate node 985 through its tunneling gate oxide layer 924 during the Fowler-Nordheim channel tunneling erase operation. The role of the erase coupling floating gate 923 couples a negative floating gate voltage to the floating gate node 985 to induce the Fowler-Nordheim edge tunneling program operation. During either channel-erase or edge-program of the floating gate nonvolatile memory cell 900, the size of the erasing charge coupling MOS transistor 920, the programming charge coupling MOS transistor 225, and the storage MOS transistor 735 have to be optimized to achieve the best performances of program and erase operation below 7.0V.

During a Fowler-Nordheim channel tunneling erase operation, the floating gate node 985 and thus the storage floating gate 228 must have a voltage level of approximately +6.3V when the first well biasing voltage source VTPW1 230 is set to approximately +7.0V and applied to the first shallow diffusion well 215. This forces a voltage level of approximately +6.3V to be coupled to the floating gate node 985. The size ratio of the programming charge coupling MOS transistor 225 to the total area of the erasing charge coupling MOS transistor 920 and the storage MOS transistor 735 is made greater than 10 times to achieve the desired coupling ratio of greater than 80%. The third shallow well biasing voltage source VTPW3 940 is set to approximately −7.0V to bias the third shallow diffusion well 915. Additionally, the erase control line 950 is set to a voltage level of approximately −7.0V to additionally insure that the channel region 975 in the third shallow diffusion well 915 is set to approximately −7.0V. The second shallow diffusion well 220 is allowed to float or is set to the ground reference voltage level (0.0V). The bit line voltage source BL 240, the source line biasing voltage source 245, and the select gating control signal 795 are set to the ground reference voltage level (0.0V). The first deep well biasing voltage source 265 and the first shallow well biasing voltage source VTPW1 230 are set to a voltage level of approximately +7.0V. The second shallow well biasing voltage source VTPW2 255 and the second deep well biasing voltage source 930 are allowed to float or are set to the ground reference voltage level (0.0V).

When the third shallow well biasing voltage source VTPW3 940 is set to approximately −7.0V to bias the third shallow diffusion well 915, the gate oxide 924 of the erasing charge coupling MOS transistor 920 would have a voltage of approximately 13.3V between floating gate node 985 and the third shallow diffusion well 915. The oxide thickness of the erasing charge coupling MOS transistor 920 is sufficiently thick to induce the Fowler-Nordheim channel tunneling effect. The electrons in third shallow diffusion well 915 are injected into the floating-gate node 985 through the tunnel gate oxide 924 of the erasing charge coupling MOS transistor 920. Since the electric field of 13.3V is across whole channel 975 of the erasing charge coupling MOS transistor 920, the erase operation is defined as Fowler-Nordheim channel erase.

Because the size of the programming charge coupling MOS transistor 225 is large, the electrical field in the gate oxide 229 is only 0.7V during erase operation. This prevents any tunneling effect in the programming charge coupling MOS transistor 225. Similarly, when the floating gate node 985 is approximately +6.3V the second shallow diffusion well 220 is biased at the ground reference voltage level (0V) or is floating, electric voltage field in the gate oxide 739 is only 6.3V, which is not sufficiently large to induce a Fowler-Nordheim tunneling effect. As a result, during the erase operation, only the added erasing charge coupling MOS transistor 920 has a sufficiently high electric field to generate the Fowler-Nordheim tunneling effect during the erase operation of the present invention. After erase, the threshold voltage of the storage MOS transistor 735 is increased due to the addition of electrons on floating gate node 985. The targeted erased threshold for this embodiment of the floating gate nonvolatile memory cell 900 is designed to be more than 4.0V for a power supply voltage source having a voltage level 3.0V.

During a Fowler-Nordheim edge tunneling program operation, the first well biasing voltage source VTPW1 230 is set to approximately −7.0V and applied to the first shallow diffusion well 215. The bit line voltage source BL 240 is set to a voltage level of approximately 5.0V for a selected floating gate nonvolatile memory cell 900 and to the ground reference voltage level (0.0V) for the non-selected floating gate nonvolatile memory cell 900. The erase control line 950 is set to the ground reference voltage level (0.0V). The second shallow diffusion well 220 is allowed to float or is set to the ground reference voltage level (0.0V). The source line biasing voltage source 245 is allowed to float or set to the ground reference voltage level (0.0V). The third shallow well biasing voltage source VTPW3 940, the erase control line 950, the select gating control signal 795, the first deep well biasing voltage source 265, and the second deep well biasing voltage source 930 are all set to the ground reference voltage level (0.0V).

With the above biasing voltages applied to the floating gate nonvolatile memory cell 900, the voltages at the floating gate node 985 is approximately −6.3V because of the greater than 80% coupling from −7.0V at the first shallow diffusion well 215 through the storage MOS transistor 735. Since the bit line voltage source BL 240 is set at +5.0V and source region 737 of the storage MOS transistor 735 is floating because the select gating control signal 795 is held at the ground reference voltage level (0.0V), the Fowler-Nordheim edge tunneling program effect is induced at the drain region 736 of the storage MOS transistor 735. The electrons would tunnel from floating gate node 985 to drain region 736 into the second shallow diffusion well 220. The threshold voltage of the storage MOS transistor 735 is decreased from the erased threshold voltage of from approximately +3.0V to approximately 4.0V to the desired programmed threshold voltage of approximately −1.0V to approximately 1.0V after the predetermined program time.

In this embodiment, the negative threshold voltage of the storage MOS transistor 735 is allowed because of the two-transistor cell structure of the storage MOS transistor 735 and select gating transistor 790. Because the select gating transistor 790 is an enhancement NMOS device, any leakage due the negative threshold of the storage MOS transistor 735 is blocked by select gating transistor 790 by setting the select gating control signal 795 to the ground reference voltage level (0.0V).

The read operation is identical that as described in FIG. 7b with the addition that the third shallow well biasing voltage source VTPW3 940 and the erase control line 950 are set to the ground reference voltage level (0.0V). The second deep well biasing voltage source 910 is allowed to float or is set to the ground reference voltage level (0.0V). The detection of the data state remains the same even though the erased program voltage level is greater for this embodiment.

It is the intent of this invention that groups of the floating gate nonvolatile memory cells 900 of this embodiment may be arranged in an array of rows and columns similar to the array shown in FIG. 8a. The necessary biasing voltage and control signals are added to the row decode controller 810 and the bit line sense amplifier 815 to provide the erasing and programming as described for the floating gate nonvolatile memory cell 900 of this embodiment.

Figures 10A, 10B:
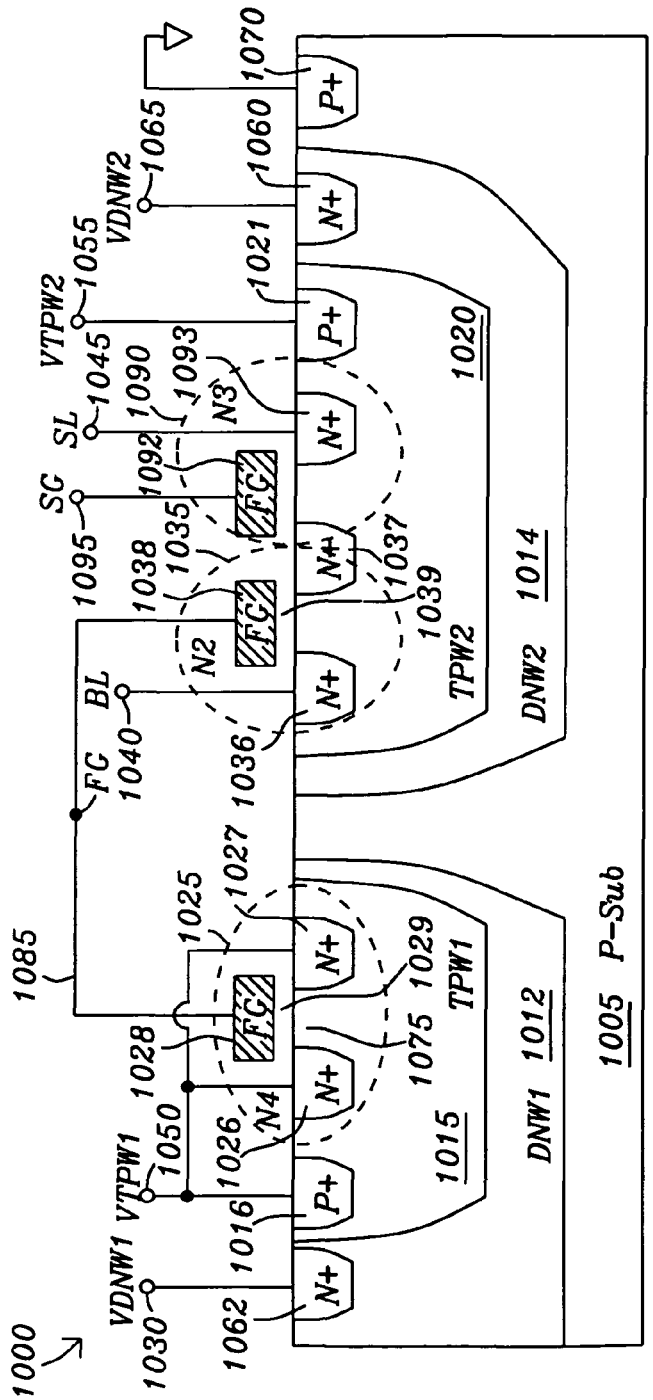

FIG. 10a provides a cross sectional diagram illustrating another embodiment of a single polycrystalline silicon floating gate nonvolatile memory cell 1000 with the capability for electrical programming and erasure. In this embodiment, the single polycrystalline silicon floating gate nonvolatile memory cell 1000 is formed on a P-type substrate 1005. A first deep diffusion well 1012 and a second deep diffusion well 1014 of an N-type impurity are formed in the top surface of the substrate 1005. The first and second deep diffusion wells 1012 and 1014 are a minor change of adding one process layer to the current single-polycrystalline silicon logic integrated circuit process. The first deep diffusion well 1012 is connected through an N-type contact 1062 to a first deep well biasing voltage source 1030. The second deep diffusion well 1014 is connected through an N-type contact 1060 to a second deep well biasing voltage source 1065. The P-type substrate is connected to the ground reference voltage source (0.0V) through the contact diffusion 1070.

A first shallow diffusion well 1015 of a P-type impurity are formed within the first deep diffusion well 1012 and a second shallow diffusion well 1020 of a P-type impurity are formed within the second deep diffusion well 1014. A charge coupling MOS transistor 1025 is connected as a capacitor. The charge coupling MOS transistor 1025 is formed in the surface of the first shallow diffusion well 1015 and has a source region 1026 and a drain region 1027 of the N-type impurity diffused into the first shallow diffusion well 1015. The source region 1026, the drain region 1027 and the first shallow diffusion well 1015 are commonly connected to a first shallow well biasing voltage source VTPW1 1050. The first shallow diffusion well 1015 being connected to the first shallow well biasing voltage source VTPW1 1050 through the contact diffusion 1016. A coupling floating gate 1028 is formed of a single polycrystalline silicon layer over a gate oxide region 1029. The gate oxide region 1029 having a material and thickness that is consistent with the commonly used technology for the construction of current CMOS logic technology.

A storage MOS transistor 1035 is then formed in the second shallow diffusion well 1020. The storage MOS transistor 1035 has a N-type drain region 1036 and a P-type source region 1037 diffused into the second shallow diffusion well 1020. The drain region 1036 is connected to a bit line voltage source BL 1040 and the source region 1037 is connected to a source line biasing voltage source 1045. A charge storage floating gate 1038 is formed of the single polycrystalline silicon layer over a gate oxide region 1039. The gate oxide region 1039 having a material and thickness that is consistent with the commonly used technology for the construction of current CMOS logic technology. The second shallow diffusion well 1020 is connected to the second shallow well biasing voltage source VTPW2 1055 through the contact diffusion 1021.

The select gating transistor 1090 is simultaneously formed in the second shallow diffusion well 1020. A N-type source region 1093 is diffused into the second shallow diffusion well 1020. The drain region 1037 of the select gating transistor 1090 is the source region of the storage MOS transistor 1035 that is a N-type impurity diffused into the second shallow diffusion well 1020. The source region 1093 of the select gating transistor 1090 is connected to the source line voltage source SL 1045. A select gate 1092 is formed of the single polycrystalline silicon layer over a gate oxide region 1094 and connected to a select gating control signal 1095. The select gating transistor 1090 provides control for connecting the storage MOS transistor 1035 to the source line 1045 during programming and reading operations.

Similar to the embodiment of the single polycrystalline silicon floating gate nonvolatile memory cell 900 of FIG. 9a, the program and erase operation employs the Fowler-Nordheim channel tunneling for the erase operation and the Fowler-Nordheim edge tunneling for the program operation. In this embodiment the charge coupling MOS transistor 1025 is required to perform both on-chip Fowler-Nordheim channel-erase and Fowler-Nordheim edge-program.

As in the embodiment of FIG. 9a, the threshold voltage of the storage MOS transistor 1035 is increased after the Fowler-Nordheim channel-erase operation. Alternately, the threshold voltage of the storage MOS transistor 1035 is decreased after the Fowler-Nordheim edge-program operation. Electrons are injected into floating gate node 1085 through the tunneling gate oxide layer 1039 of the storage MOS transistor 1035 to increase the threshold voltage of the storage MOS transistor 1035.

Refer now to FIG. 10b for an explanation of the erase and program operations. In the erase operation, the first shallow well biasing voltage source VTPW1 1050 is set to a voltage level of approximately +7.0V to be applied to the first shallow diffusion well 1015 of the charge coupling MOS transistor 1025 capacitor. The second shallow well biasing voltage source VTPW2 1055 is set to a voltage level of approximately −7.0V to be applied to the second shallow diffusion well 1020. The source line voltage source 1045 is set to a voltage level of approximately −7.0V. The bit line voltage source 1040 is disconnected from the drain region 1036 of the storage MOS transistor 1035 to float the drain region 1036. The first deep well biasing voltage source 1030 and thus the first deep diffusion well 1012 is set to approximately +7.0V to induce the Fowler-Nordheim channel erase as well as prevent the undesired forward current flow in the first deep diffusion well 1012, the second deep diffusion well 1014, the first shallow diffusion well 1015, and the second shallow diffusion well 1020. The select gate control signal 1095 and the second deep well biasing voltage source 1065 are set to the ground reference voltage level (0.0V). Like previous cell structure, the size of the charge coupling MOS transistor 1025 capacitor is made much larger than storage MOS transistor 1035. The preferable size ratio between the charge coupling MOS transistor 1025 and the storage MOS transistor 1035 is 10 times or greater to achieve more than an 80% coupling ratio to reduce the required high-voltage for low-voltage compatible logic process.

The biasing voltages, as described above, force the voltage level present on the floating gate node 1085 to be approximately +6.3V due to the high coupling ratio (>80%) the first shallow diffusion well 1015 with a voltage level of approximately +7.0V through the charge coupling MOS transistor 1025 capacitor. With the second shallow diffusion well 1020 set to a voltage level of approximately −7.0V, a large electric field is established at tunneling gate oxide layer 1039 between floating gate node 1085 and the second shallow diffusion well 1020 where the Fowler-Nordheim channel tunneling is induced. Electrons from the second shallow diffusion well 1020 are injected into the charge storage floating gate 1038 to the floating gate node 1085, through tunneling gate oxide layer 1039 of the storage MOS transistor 1035. As a consequence, the number of electrons is increased at the floating gate node 1085 after channel erase operation such that the threshold voltage of the storage MOS transistor 1035 is increased to the desired value of approximately 4.0V for an array of the floating gate nonvolatile memory cell 1000 of this embodiment using a power supply voltage source (VDD) of approximate 3.0V.

During a Fowler-Nordheim edge tunneling program operation, the first well biasing voltage source VDNW1 1030 is set to approximately −7.0V and applied to the first shallow diffusion well 1062. The bit line voltage source BL 1040 is set to a voltage level of approximately 5.0V for application to the drain of the storage MOS transistor 1035 for programming a selected floating gate nonvolatile memory cell 1000. The bit line voltage source BL 1040 is set to the ground reference voltage level (0.0V) for application to the drain of the storage MOS transistor 1035 for inhibiting programming the non-selected floating gate nonvolatile memory cell 1000. The second shallow well biasing voltage source VTPW2 1055 is disconnected or set to the ground reference voltage level (0.0V) such that the second shallow diffusion well 1020 is allowed to float or is set to the ground reference voltage level (0.0V). The source line biasing voltage source 1045 and thus the source 1093 of the select gating transistor 1090 is allowed to float or set to the ground reference voltage level (0.0V). The select gating control signal 1095, the first deep well biasing voltage source 1030, and the second deep well biasing voltage source 1065 are all set to the ground reference voltage level (0.0V).

With the above biasing voltages applied to the floating gate nonvolatile memory cell 1000, the voltages at the floating gate node 1085 is approximately −6.3V because of the greater than 80% coupling from −7.0V at the first shallow diffusion well 1015 through the storage MOS transistor 1025. Since the bit line voltage source BL 1040 is set at +5.0V and source region 1037 of the storage MOS transistor 1035 is floating because the select gating control signal 1095 is held at the ground reference voltage level (0.0V), the Fowler-Nordheim edge tunneling program effect is induced at the drain region 1036 of the storage MOS transistor 1035. The electrons would tunnel from floating gate node 1085 to drain region 1036 into the second shallow diffusion well 1020. The threshold voltage of the storage MOS transistor 1035 is decreased from the erased threshold voltage of from approximately +3.0V to approximately 4.0V to the desired programmed threshold voltage of approximately 1.0V after the predetermined program time.

The advantage of this embodiment of the single polycrystalline silicon floating gate nonvolatile memory cell 1000 over the embodiment single polycrystalline silicon floating gate nonvolatile memory cell 900 of FIG. 9A is only one NMOS capacitor (charge coupling MOS transistor 1025) is required to perform both on-chip Fowler-Nordheim erase operation and Fowler-Nordheim program operation. The physical size of the floating gate nonvolatile memory cell 1000 is smaller thus reducing the cost of the substrate 1025

It is the intent of this invention that groups of the floating gate nonvolatile memory cells 1000 of this embodiment may be arranged in an array of rows and columns similar to the array shown in FIG. 8a. The necessary biasing voltage and control signals are added to the row decode controller 810 and the bit line sense amplifier 815 to provide the erasing and programming as described for the floating gate nonvolatile memory cell 1000 of this embodiment.

Figures 11A, 11B:
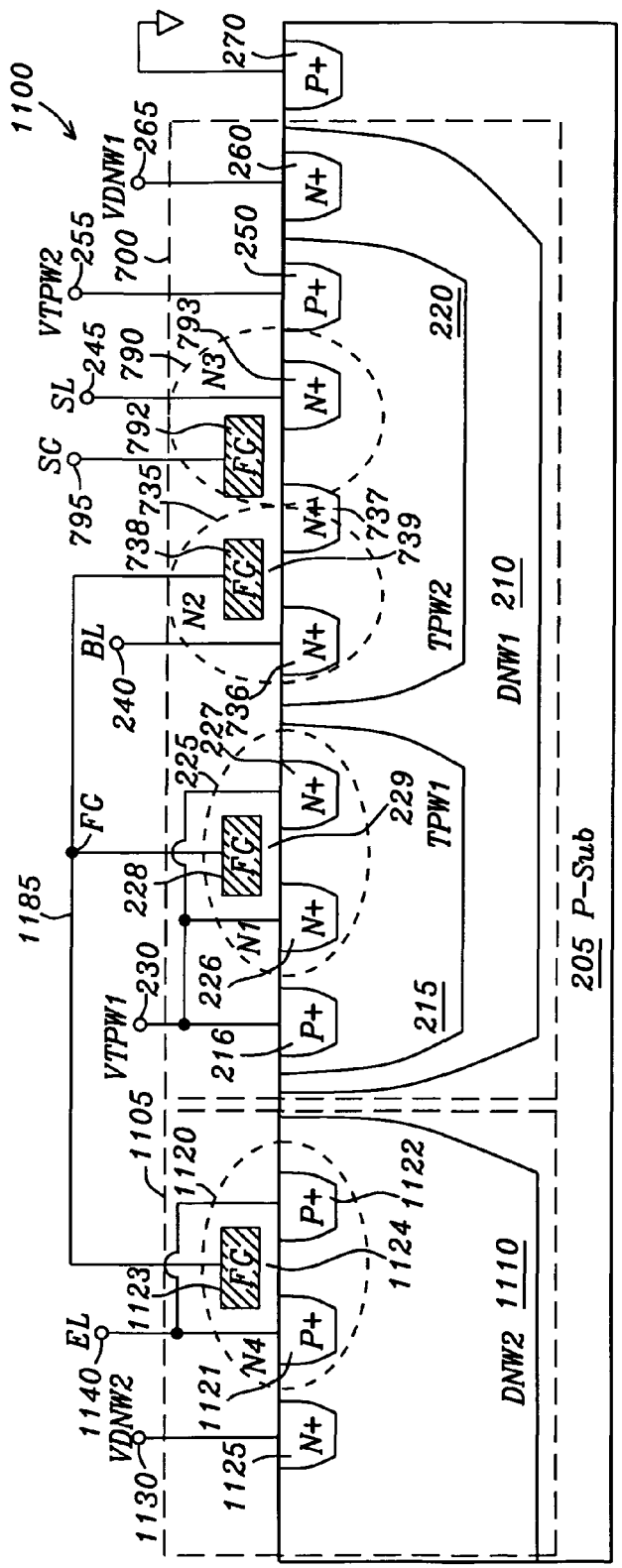

Refer now to FIG. 11a for a discussion of the structure of another embodiment of the single polycrystalline silicon floating gate nonvolatile memory cell 1100 of this invention. The structure of this embodiment is essentially identical to that of FIG. 9a with the exception that the second deep diffusion well 910 is replaced with a second deep diffusion well 1110 that has no shallow diffusion well. The second deep diffusion well 1110 is connected to the second deep well biasing voltage source 1130. The erasing element 905 is replaced with an erasing element 1105.

The programming and charge storage device 700 has the programming charge coupling MOS transistor 225, the storage MOS transistor 735, and select gating transistor 790 is structured and functions as described in FIGS. 7a and 7b. The erasing charge coupling MOS capacitor 1120 has two P-type diffusion regions 1121 and 1122 formed in the second deep diffusion well 1110 and is connected to the erase line control signal 1140. The erase coupling floating gate 1123 is coupled to the charge storage floating gate 738 and the programming coupling floating gate 228 to form the floating gate node 1185.

In this embodiment, the erase operation is changed from the Fowler-Nordheim channel tunneling erase operation of FIG. 9a to a Fowler-Nordheim edge tunneling erase operation to further reduce the operating voltage for on-chip write operation.

Referring now to FIG. 11b for a description of the Fowler-Nordheim edge tunneling erase operation, the first shallow well biasing voltage source VTPW1 230 and thus the first shallow diffusion well 215 is set to approximately +7.0V voltage. The second shallow well biasing voltage source VTPW2 255 is either disconnected or set to the ground reference voltage level (0.0V) to either float the second shallow diffusion well 220 or set the first shallow diffusion well 215 to the ground reference voltage level (0.0V). The second deep well biasing voltage source VDNW2 1130 is either disconnected or set to the ground reference voltage level (0.0V) to either float the second deep diffusion well 1110 or set the second deep diffusion well 1110 to the ground reference voltage level (0.0V). The Erase Line control signal EL 1140 connected to the diffusion regions 1121 and 1122 of the PMOS erasing charge coupling capacitor 1120 is set to a voltage level of approximately −5.0V. The first deep well biasing voltage source VDNW1 265 and thus the first deep diffusion well 210 is set to a voltage level of approximately +7.0V. The bit line voltage source BL 240, the source line biasing voltage source 245, and the select gating control signal 795 are each set to the voltage level of the ground reference voltage level (0.0V).

With the biasing levels as above described, a high electric field is established at source and drain diffusion regions 1121 and 1122 of PMOS erasing charge coupling capacitor 1120. The erase coupling floating gate 1123 of PMOS erasing charge coupling capacitor 1120 is coupled to a voltage level of approximately −6.3V. This occurs because the coupling ratio of the PMOS erasing charge coupling capacitor 1120 and the combination of the programming charge coupling MOS transistor 225 and the storage MOS transistor 735 is large (greater than 80%). Thus the coupling of the voltage of +7.0V from the first shallow diffusion well 215 forces the floating gate node 1185 and thus the erase coupling floating gate 1123 to be at the 6.3V. The PMOS erasing charge coupling capacitor 1120 will remain in the non-conduction state with the voltage level of −5.0V present on the erase line control signal. This induces a Fowler-Nordheim edge tunneling erase effect at edges of the source and drain diffusion regions 1121 and 1122. The voltage levels as described prevent undesired forward current flow in the first deep diffusion well 210, the second deep diffusion well 1110, first shallow diffusion well 215, and the second shallow diffusion well 220.

In the Fowler-Nordheim edge tunneling program operation, the voltage levels of the floating gate nonvolatile memory cell 1100 of this embodiment are essentially has a reversed polarity from those used for the Fowler-Nordheim edge tunneling erase operation, as described above. The first shallow well biasing voltage source VTPW1 230 and thus the first shallow diffusion well 215 is set to approximately −7.0V voltage. The bit line voltage source BL 240 is set to a voltage level of approximately +5.0V for selected floating gate nonvolatile memory cells 1100. For the non-selected floating gate nonvolatile memory cells 1100, the bit line voltage source BL 240 is set to the ground reference voltage level (0.0V). The second shallow well biasing voltage source VTPW2 255 and thus the first shallow diffusion well 215 is set to the ground reference voltage level (0.0V). The second shallow well biasing voltage source VTPW2 255 is disconnected or set to the ground reference voltage level (0.0V) to either float the second shallow diffusion well 220 or set to the ground reference voltage level (0.0V). The erase line control signal EL 1140 connected to the diffusion regions 1121 and 1122 of the PMOS erasing charge coupling capacitor 1120 is set to the ground reference voltage level (0.0V). The first deep well biasing voltage source VDNW1 265 and thus the first deep diffusion well 210 and the second deep diffusion well 1110 is set to the ground reference voltage level (0.0V). The select gating control signal SG 795 and thus the floating gate of the select gating transistor 790, and the source line biasing voltage source 245 and thus the source 793 of the select gating transistor 790 is set to the ground reference voltage level (0.0V).

In the program operation, the voltage level of the select gating control signal 795 and the erase line control signal 1140 are held at ground reference voltage level (0.0V) to shut off the select gating transistor 790 so that the source of the storage MOS transistor 735 is floating to favor Fowler-Nordheim edge tunneling program operation. A low-current Fowler-Nordheim edge tunneling phenomena occurs at the drain of the storage MOS transistor 735 when the voltages of FIG. 11*b* are applied to the floating gate nonvolatile memory cells 1100. As a result, electrons are extracted from the floating gate node 1185 to drain 736 of the selected floating gate nonvolatile memory cells 1100. The threshold voltage is decreased to a threshold voltage ranging from −1.0V to 1.0V after the Fowler-Nordheim edge-program operation.

In a read operation, the first shallow well biasing voltage source VTPW1 230 is set to a read detection voltage biasing voltage level ($V_{READ}$) which is then coupled to the floating gate node 1185. The read detection voltage ($V_{READ}$) is set between the erased threshold voltage level Vt1 and the programmed threshold voltage level Vt2. The bit line voltage source BL 240 is set to approximately 1.0V. The second shallow well biasing voltage source VTPW2 255, the erase control signal 1140, and the source line biasing voltage source 245 are set to the ground reference voltage source (0.0V). The first deep well biasing voltage source 265 and the second shallow well biasing voltage source 255 is set to the voltage level of the power supply voltage source (VDD). The select gating control signal 795 is set to the power supply voltage source (VDD) for the selected floating gate nonvolatile memory cell 1100. The select gating control signal 795 is set to the ground reference voltage level (0.0V) for the non-selected floating gate nonvolatile memory cell 1100.

If the floating gate nonvolatile memory cell 1100 is programmed, then voltage level at the floating gate node 1185 is approximately the level of second threshold level and there would be current conduction flow through the floating gate nonvolatile memory cell 1100 from the bit line voltage source BL 240 to the a source line biasing voltage source 245. When the threshold voltage level of the floating gate nonvolatile memory cell 1100 is the second threshold voltage level Vt2, the read data is designated as a binary "0". If the floating gate nonvolatile memory cell 1100 is not selected to be programmed, then its threshold voltage remains at its erased threshold voltage level Vt1. Therefore the voltage level at the floating gate node 1185 is less than the erased threshold voltage level Vt1. When there is no current conduction for floating gate nonvolatile memory cell 1100 and the threshold voltage of the floating gate nonvolatile memory cell 1100 is the erased threshold level, the binary read data designated as a binary "1".

As in the other embodiments of this invention the, the physical size of the programming charge coupling MOS transistor 225 is made much larger than the combined physical sizes of the storage MOS transistor 735 and programming charge coupling MOS transistor 225. The ratio of the physical sizes is approximately 10 times larger to the total areas of the combined physical sizes of the storage MOS transistor 735 and programming charge coupling MOS transistor 225 to achieve more than 80% coupling ratio to reduce the required voltage level such that a low-voltage compatible logic integrated circuit process is employed for manufacturing a nonvolatile memory device that includes an array of the floating gate nonvolatile memory cells 1100.

It is the intent of this invention that groups of the floating gate nonvolatile memory cells 1100 of this embodiment may be arranged in an array of rows and columns similar to the array shown in FIG. 8*a*. The necessary biasing voltage and control signals are added to the row decode controller 810 and the bit line sense amplifier 815 to provide the erasing and programming as described for the floating gate nonvolatile memory cell 1100 of this embodiment.

A single polycrystalline silicon floating gate nonvolatile memory cell has a MOS capacitor and a MOS transistor fabricated with dimensions that allow fabrication using current low voltage logic integrated circuit process. The MOS capacitor has a first plate connected to a gate of the MOS transistor such that the gate of the MOS transistor is floating and forms a floating gate node of the floating gate nonvolatile memory cell. The second plate of the MOS capacitor is normally a drain diffusion, source diffusion, and bulk of a MOS transistor. The drain of the MOS transistor is connected to a bit line voltage source and the source of the MOS transistor is connected to a source line. The physical size of the MOS capacitor is relatively large when compared to the physical size of the MOS transistor. The ratio of the physical size of the MOS capacitor to that of the MOS transistor is 10 times or greater for the embodiments of this invention.

The large ratio of physical size between the MOS capacitor and the MOS transistor provides a large coupling ratio of greater than 80%. When a voltage is applied to the second plate of the MOS capacitor, the large coupling ratio enables the coupling of a large fraction of the voltage applied to the second plate of the MOS capacitor to be coupled to the floating gate node. A voltage is applied to the source region or drain region of the MOS transistor establishes a voltage field within the gate oxide of the MOS transistor such that Fowler-Nordheim edge tunnel is initiated. When the voltage at the second plate is negative and the voltage applied to the drain (or source) of the MOS transistor is positive, charges present on the floating gate are extracted to program the floating gate nonvolatile memory cell. Alternately, the voltage at the second plate is positive and the voltage applied to the drain (or source or bulk) of the MOS transistor is negative, charges present on the floating gate are injected to erase the floating gate nonvolatile memory cell. The above described embodiments provide variations and details of this structure and voltage levels required for establishing the Fowler-Nordheim is tunneling.

While this invention has been particularly shown and described with reference to the preferred embodiments thereof, it will be understood by those skilled in the art that various changes in form and details may be made without departing from the spirit and scope of the invention.

The invention claimed is:

1. A nonvolatile memory cell formed on a substrate, the nonvolatile memory cell comprising:
   a first deep diffusion well of an impurity of a first conductivity type formed in a surface of the substrate;
   a first shallow diffusion well of an impurity of a second conductivity type formed within the first deep diffusion well;
   a second shallow diffusion well of the second conductivity type formed within the first deep diffusion well;
   a programming charge coupling metal oxide semiconductor (MOS) transistor connected as a capacitor wherein the programming charge coupling MOS transistor comprises:
      a program coupling floating gate formed of a single polycrystalline silicon layer,
      a source region of the impurity of the first conductivity type diffused into the first shallow diffusion well, and
      a drain region of the impurity of the first conductivity type diffused into the first shallow diffusion well and commonly connected to the source region, the first shallow diffusion well, and a first well biasing voltage source;
   a storage MOS transistor comprising:
      a charge storage floating gate formed the single polycrystalline silicon layer connected to the program coupling floating gate to form a floating gate node,
      a source region of the impurity of the first conductivity type diffused into the second shallow diffusion well and connected to a source line biasing voltage source, and
      a drain region of the impurity of the first conductivity type diffused into the second shallow diffusion well;
   wherein the physical size of the programming charge coupling MOS transistor is relatively large when compared to a physical size of the storage MOS transistor to establish a large coupling ratio between a bulk region, the source region, the drain region of the coupling MOS transistor and the floating gate node
   wherein the threshold voltage of the storage MOS transistor is set to an erased threshold voltage level to erase the nonvolatile memory cell and to a programmed threshold voltage level to program the nonvolatile memory cell.

2. The nonvolatile memory cell of claim 1 wherein the second shallow diffusion well is connected to a second well biasing voltage source.

3. The nonvolatile memory cell of claim 1 wherein the first deep diffusion well is connected to a first deep well biasing voltage source.

4. The nonvolatile memory cell of claim 1 wherein the drain of the storage MOS transistor is connected to a bit line biasing voltage source.

5. The nonvolatile memory cell of claim 1 wherein the coupling ratio is greater than 80%.

6. The nonvolatile memory cell of claim 1 wherein the nonvolatile memory cell is programmed by Fowler-Nordheim charge tunneling through a gate oxide between the charge storage floating gate and the drain region of the storage MOS transistor.

7. The nonvolatile memory cell of claim 6 wherein to the nonvolatile memory cell is programmed by setting the first well biasing voltage source to a voltage level of from approximately −7.0V to approximately −5.0V and the bit line biasing voltage source to a voltage level of from approximately +5.0V to approximately +7.0V to set the threshold voltage of the storage MOS transistor to the programmed threshold voltage level.

8. The nonvolatile memory cell of claim 7 wherein the programmed threshold voltage level is from approximately 0.0V to approximately 1.0V.

9. The nonvolatile memory cell of claim 1 wherein the nonvolatile memory cell is erased by setting the threshold voltage of the storage MOS transistor to the erased threshold voltage level.

10. The nonvolatile memory cell of claim 9 wherein the erased threshold voltage level is from approximately +3.0V to approximately +4.0V.

11. The nonvolatile memory cell of claim 4 wherein reading the nonvolatile memory cell detects whether the threshold voltage of the storage MOS transistor is the programmed threshold voltage level or the erased threshold voltage level.

12. The nonvolatile memory cell of claim 11 wherein, in reading the nonvolatile memory cell, the second shallow diffusion well is set to a voltage level that is greater than the programmed threshold voltage level and less than the erased threshold voltage level and the bit line biasing voltage source biasing voltage level is set to approximately +1.0V.

13. The nonvolatile memory cell of claim 1 further comprising a select gating transistor comprising:
   a select gate MOS transistor comprising:
      a select gate connected to a select gate control terminal;
      a source region of the impurity of the first conductivity type diffused into the second shallow diffusion well and connected to the source line biasing voltage source; and
      a drain region of the impurity of the first conductivity type that is the source region of the storage MOS transistor.

14. The nonvolatile memory cell of claim 13 wherein the second shallow diffusion well is connected to a second well biasing voltage source.

15. The nonvolatile memory cell of claim 13 wherein the first deep diffusion well is connected to a first deep well biasing voltage source.

16. The nonvolatile memory cell of claim 13 wherein the storage MOS transistor is connected to a bit line biasing voltage source.

17. The nonvolatile memory cell of claim 13 wherein the physical size of the programming charge coupling MOS transistor is relatively large when compared to a physical size of the storage MOS transistor to establish a large coupling ratio between a bulk region, the source region, the drain region of the coupling MOS transistor and the floating gate node.

18. The nonvolatile memory cell of claim 17 wherein the coupling ratio is greater than 80%.

19. The nonvolatile memory cell of claim 15 wherein the nonvolatile memory cell is programmed by Fowler-Nordheim charge tunneling through a gate oxide between the charge storage floating gate and the drain region of the storage MOS transistor.

20. The nonvolatile memory cell of claim 19 wherein to the nonvolatile memory cell is programmed by setting the first well biasing voltage source to a voltage level of from approximately −7.0V to approximately −5.0V, and the bit line biasing voltage source to a voltage level of from approximately +5.0V to approximately +7.0V, and the select gate control terminal is set to a deactivation voltage level to turn off the select gate MOS transistor to set the threshold voltage of the storage MOS transistor to the programmed threshold voltage level.

21. The nonvolatile memory cell of claim 19 wherein the programmed threshold voltage level is from approximately 0.0V to approximately 1.0V.

22. The nonvolatile memory cell of claim 13 wherein the nonvolatile memory cell is erased by setting the threshold voltage of the storage MOS transistor to the erased threshold voltage level.

23. The nonvolatile memory cell of claim 22 wherein the erased threshold voltage level is from approximately +3.0V to approximately +4.0V.

24. The nonvolatile memory cell of claim 1 wherein reading the nonvolatile memory cell detects whether the threshold voltage of the storage MOS transistor is the programmed threshold voltage level or the erased threshold voltage level.

25. The nonvolatile memory cell of claim 24 wherein, in reading the nonvolatile memory cell, the second shallow diffusion well is set to a voltage level that is greater than the programmed threshold voltage level and less than the erased threshold voltage level, the bit line biasing voltage source is set to approximately +1.0V, the source line biasing voltage source is set to the ground reference voltage level, and the select gate control terminal is set to an activation voltage level to turn on the select gate MOS transistor to read a program state of the nonvolatile memory cell.

26. The nonvolatile memory cell of claim 1 further comprising:
a second deep diffusion well of the impurity of the first conductivity type formed in the surface of the substrate;
a third shallow diffusion well of the impurity of the second conductivity type formed within the second deep diffusion well; and
an erasing charge coupling MOS transistor comprising:
an erase coupling floating gate formed the single polycrystalline silicon layer connected to the program coupling floating gate and the charge storage floating gate and having a small size relative to the program coupling floating gate;
a source region of the impurity of the first conductivity type diffused into the third shallow diffusion well; and
a drain region of the impurity of the first conductivity type diffused into the third shallow diffusion well and connected to the source region.

27. The nonvolatile memory cell of claim 26 wherein the second shallow diffusion well is connected to a second well biasing voltage source.

28. The nonvolatile memory cell of claim 27 wherein the second deep diffusion well is connected to a second deep well biasing voltage source.

29. The nonvolatile memory cell of claim 26 wherein the drain of the storage MOS transistor is connected to a bit line biasing voltage source.

30. The nonvolatile memory cell of claim 26 wherein the drain of the erasing charge coupling MOS transistor is connected to an erase line biasing voltage source.

31. The nonvolatile memory cell of claim 26 wherein the physical size of the programming charge coupling MOS transistor is relatively large when compared to a physical size of the storage MOS transistor to establish a large coupling ratio between a bulk region, the source region, the drain region of the coupling MOS transistor and the floating gate node.

32. The nonvolatile memory cell of claim 31 wherein the coupling ratio is greater than 80%.

33. The nonvolatile memory cell of claim 26 wherein the nonvolatile memory cell is programmed by Fowler-Nordheim charge tunneling through a gate oxide between the charge storage floating gate and the drain region of the storage MOS transistor.

34. The nonvolatile memory cell of claim 29 wherein to the nonvolatile memory cell is programmed by setting the first well biasing voltage source to a voltage level of from approximately −7.0V to approximately −5.0V and the bit line biasing voltage source to a voltage level of from approximately +5.0V to approximately 7.0V to set the threshold voltage of the storage MOS transistor to the programmed threshold voltage level.

35. The nonvolatile memory cell of claim 34 wherein the programmed threshold voltage level is from approximately 0.0V to approximately 1.0V.

36. The nonvolatile memory cell of claim 26 wherein the nonvolatile memory cell is erased by Fowler-Nordheim charge tunneling through a gate oxide between the erase coupling floating gate and a channel region of the erasing charge coupling MOS transistor set the threshold voltage of the storage MOS transistor to the erased threshold voltage level.

37. The nonvolatile memory cell of claim 26 wherein the erased threshold voltage level is from approximately +3.0V to approximately +4.0V.

38. The nonvolatile memory cell of claim 30 wherein the nonvolatile memory cell is erased by setting the erase line biasing voltage source to a voltage level of from approximately −7.0V to approximately −5.0V the first well biasing voltage source to a voltage level of from approximately +5.0V to approximately +7.0V, the third well biasing voltage source to a voltage level of from approximately −7.0V to approximately −5.0V, and the first deep well biasing voltage source to a voltage level of from approximately +5.0V to approximately +7.0V to set the threshold voltage of the storage MOS transistor to the erased threshold voltage level.

39. The nonvolatile memory cell of claim 26 wherein reading the nonvolatile memory cell detects whether the threshold voltage of the storage MOS transistor is the programmed threshold voltage level or the erased threshold voltage level.

40. The nonvolatile memory cell of claim 29 wherein, in reading the nonvolatile memory cell, the second shallow diffusion well is set to a voltage level that is greater than the programmed threshold voltage level and less than the erased threshold voltage level, the bit line biasing voltage source biasing voltage level is set to approximately +1.0V, the source line biasing voltage source is set to the ground reference voltage level, and the select gate control terminal is set to an activation voltage level to turn on the select gate MOS transistor to read a program state of the nonvolatile memory cell.

41. A nonvolatile memory cell formed on a substrate, the nonvolatile memory cell comprising:
a common deep diffusion well of an impurity of a first conductivity type formed in a surface of the substrate;
a first shallow diffusion well of an impurity of a second conductivity type formed within the common deep diffusion well;
a second shallow diffusion well of the second conductivity type formed within the common deep diffusion well;
a charge coupling MOS capacitor wherein the charge coupling MOS capacitor comprises:
a coupling floating gate formed a single polycrystalline silicon layer,
a first diffusion region of an impurity of the second conductivity type diffused into the first shallow diffusion well, and
a second diffusion region of the impurity of the second conductivity type diffused into the first shallow diffusion well and commonly connected to the first diffusion region, and a first well biasing voltage source;
a storage MOS transistor comprising:
a charge storage floating gate formed the single polycrystalline silicon layer connected to the coupling floating gate to form a floating gate node,
a source region of the impurity of the first conductivity type diffused into the second shallow diffusion well and connected to a source line biasing voltage source, and
a drain region of the impurity of the first conductivity type diffused into the second shallow diffusion well and connected to a bit line biasing voltage source;
wherein the physical size of the charge coupling MOS capacitor is relatively large when compared to a physical size of the storage MOS transistor to establish a large coupling ratio between a bulk region, the source region, the drain region of the charge coupling MOS capacitor and the floating gate node; and
wherein the threshold voltage of the storage MOS transistor is set to an erased threshold voltage level to erase the nonvolatile memory cell and to a programmed threshold voltage level to program the nonvolatile memory cell.

42. The nonvolatile memory cell of claim 41 wherein the second shallow diffusion well is connected to a second well biasing voltage source.

43. The nonvolatile memory cell of claim 41 wherein the deep diffusion well is connected to a deep well biasing voltage source.

44. The nonvolatile memory cell of claim 41 wherein the coupling ratio is greater than 80%.

45. The nonvolatile memory cell of claim 41 wherein the nonvolatile memory cell is programmed by Fowler-Nordheim charge tunneling through a gate oxide between the charge storage floating gate and the drain region of the storage MOS transistor.

46. The nonvolatile memory cell of claim 41 wherein to the nonvolatile memory cell is programmed by setting the first well biasing voltage source to a voltage level of from approximately −7.0V to approximately −5.0V and the bit line biasing voltage source to a voltage level of from approximately +5.0V to approximately +7.0V to set the threshold voltage of the storage MOS transistor to the programmed threshold voltage level.

47. The nonvolatile memory cell of claim 41 wherein the programmed threshold voltage level is from approximately 0.0V to approximately 1.0V.

48. The nonvolatile memory cell of claim 41 wherein the nonvolatile memory cell is erased by setting the threshold voltage of the storage MOS transistor to the erased threshold voltage level.

49. The nonvolatile memory cell of claim 48 wherein the erased threshold voltage level is from approximately +3.0V to approximately +4.0V.

50. The nonvolatile memory cell of claim 41 wherein reading the nonvolatile memory cell detects whether the threshold voltage of the storage MOS transistor is the programmed threshold voltage level or the erased threshold voltage level.

51. The nonvolatile memory cell of claim 41 wherein, in reading the nonvolatile memory cell, the second shallow diffusion well is set to a voltage level that is greater than the programmed threshold voltage level and less than the erased threshold voltage level, the bit line biasing voltage source biasing voltage level is set to approximately +1.0V, the source line biasing voltage source is set to the ground reference voltage level, and the select gate control terminal is set to an activation voltage level to turn on the select gate MOS transistor to read a program state of the nonvolatile memory cell.

52. A nonvolatile memory cell formed on a substrate, the nonvolatile memory cell comprising:
a first deep diffusion well of an impurity of a first conductivity type formed in a surface of the substrate;
a second deep diffusion well of an impurity of the first conductivity type formed in a surface of the substrate;
a first shallow diffusion well of an impurity of a second conductivity type formed within the first deep diffusion well;
a second shallow diffusion well of the second conductivity type formed within the second deep diffusion well;
a charge coupling metal oxide semiconductor (MOS) transistor connected as a capacitor wherein the charge coupling MOS transistor comprises:
a programming coupling floating gate formed a single polycrystalline silicon layer,
a source region of the impurity of the first conductivity type diffused into the first shallow diffusion well, and
a drain region of the impurity of the first conductivity type diffused into the first shallow diffusion well and commonly connected to the source region, first shallow diffusion well, and a first well biasing voltage source;
a storage MOS transistor comprising:
a charge storage floating gate formed the single polycrystalline silicon layer connected to the program coupling floating gate to form a floating gate node,
a source region of the impurity of the first conductivity type diffused into the second shallow diffusion well and connected to a source line biasing voltage source, and
a drain region of the impurity of the first conductivity type diffused into the second shallow diffusion well;
a select gate MOS transistor comprising:
a select gate connected to a select gate control terminal;
a source region of the impurity of the first conductivity type diffused into the second shallow diffusion well and connected to the source line biasing voltage source; and
a drain region of the impurity of the first conductivity type that is the source region of the storage MOS transistor;
wherein the physical size of the charge coupling MOS capacitor is relatively large when compared to a physical size of the storage MOS transistor to establish a large coupling ratio between a bulk region, the source region, the drain region of the charge coupling MOS capacitor and the floating gate node; and
wherein the threshold voltage of the storage MOS transistor is set to an erased threshold voltage level to erase the nonvolatile memory cell and to a programmed threshold voltage level to program the nonvolatile memory cell.

53. The nonvolatile memory cell of claim 52 wherein the second shallow diffusion well is connected to a second well biasing voltage source.

54. The nonvolatile memory cell of claim 52 wherein the first deep diffusion well is connected to a first deep well biasing voltage source.

55. The nonvolatile memory cell of claim 52 wherein the second deep diffusion well is connected to a second deep well biasing voltage source.

56. The nonvolatile memory cell of claim 52 wherein the drain of the storage MOS transistor is connected to a bit line biasing voltage source.

57. The nonvolatile memory cell of claim 52 wherein the coupling ratio is greater than 80%.

58. The nonvolatile memory cell of claim 52 wherein the nonvolatile memory cell is programmed by Fowler-Nordheim charge tunneling through a gate oxide between the charge storage floating gate and the drain region of the storage MOS transistor.

59. The nonvolatile memory cell of claim 56 wherein to the nonvolatile memory cell is programmed by setting the first well biasing voltage source to a voltage level of from approximately −7.0V to approximately −5.0V and the bit line biasing voltage source to a voltage level of from approximately +5.0V to approximately +7.0V to set the threshold voltage of the storage MOS transistor to the programmed threshold voltage level.

60. The nonvolatile memory cell of claim 52 wherein the programmed threshold voltage level is from approximately 0.0V to approximately 1.0V.

61. The nonvolatile memory cell of claim 52 wherein the nonvolatile memory cell is erased by Fowler-Nordheim charge tunneling through a gate oxide between the erase coupling floating gate and a channel region of the erasing charge coupling MOS transistor set the threshold voltage of the storage MOS transistor to the erased threshold voltage level.

62. The nonvolatile memory cell of claim 52 wherein the erased threshold voltage level is from approximately +3.0V to approximately +4.0V.

63. The nonvolatile memory cell of claim 56 wherein the nonvolatile memory cell is erased by setting the first well biasing voltage source to a voltage level of from approximately +5.0V to approximately +7.0V, the second well biasing voltage source to a voltage level of from approximately −7.0V to approximately −5.0V, and the first deep well biasing voltage source to a voltage level of from approximately +5.0V to approximately +7.0V, and the source line biasing voltage source is set to a voltage level of from approximately −7.0V to approximately −5.0V to set the threshold voltage of the storage MOS transistor to the programmed threshold voltage level.

64. The nonvolatile memory cell of claim 52 wherein reading the nonvolatile memory cell detects whether the threshold voltage of the storage MOS transistor is the programmed threshold voltage level or the erased threshold voltage level.

65. The nonvolatile memory cell of claim 56 wherein, in reading the nonvolatile memory cell, the first shallow diffusion well is set to a voltage level that is greater than the programmed threshold voltage level and less than the erased threshold voltage level, the bit line biasing voltage source biasing voltage level is set to approximately +1.0V, the source line biasing voltage source is set to the ground reference voltage level, and the select gate control terminal is set to an activation voltage level to turn on the select gate MOS transistor to read a program state of the nonvolatile memory cell.

* * * * *